(12) United States Patent
Hur et al.

(10) Patent No.: US 8,704,575 B2
(45) Date of Patent: Apr. 22, 2014

(54) TUNABLE ACTIVE DIRECTIONAL COUPLERS

(75) Inventors: Byul Hur, Gainesville, FL (US); William Richard Eisenstadt, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 13/526,031

(22) Filed: Jun. 18, 2012

(65) Prior Publication Data

US 2013/0147535 A1    Jun. 13, 2013

Related U.S. Application Data

(60) Provisional application No. 61/498,191, filed on Jun. 17, 2011.

(51) Int. Cl.
*H03H 11/16* (2006.01)
*H01P 5/22* (2006.01)

(52) U.S. Cl.
USPC ............ 327/231; 327/233; 333/109; 333/111

(58) Field of Classification Search
USPC ................. 327/231, 233–235; 333/109, 111, 333/113–114, 164, 202, 205
See application file for complete search history.

(56) References Cited

U.S. PATENT DOCUMENTS

| | | | |
|---|---|---|---|
| 5,014,023 A * | 5/1991 | Mantele .......................... | 333/164 |
| 7,129,783 B2 | 10/2006 | Young et al. | |
| 7,538,635 B2 * | 5/2009 | Fukuda et al. ................. | 333/117 |
| 7,863,998 B2 * | 1/2011 | Rofougaran .................... | 333/25 |
| 8,228,134 B2 * | 7/2012 | Rofougaran ................... | 333/109 |

OTHER PUBLICATIONS

Song, T.-Y., et al., "Design of a Novel Lumped Element Backward Directional Coupler Based on Parallel Coupled-Line Theory," 2002, IEEE MTT-S International Microwave Symposium Digest, pp. 213-216.

Alpha Industries Inc., "A Varactor Controlled Phase Shifter for PCS Base Station Applications," 2002, Application Note APN 1009, formerly located at www.alphaind.com (updated document now at http://www.skyworksinc.com/uploads/documents/200319B.pdf).

* cited by examiner

*Primary Examiner* — An Luu
(74) *Attorney, Agent, or Firm* — Saliwanchik, Lloyd & Eisenschenk

(57) ABSTRACT

Active directional couplers are provided. In accordance with certain embodiments of the invention, the subject active directional couplers are tunable. The tuning is accomplished via varactors connected to the lines of the active directional couplers. Active directional elements are provided between different lines of the subject active directional couplers to control a signal path between ports of the different lines. The active directional elements are selected from diodes, transistors, inverting amplifiers, non-inverting amplifiers, differential amplifiers, and active baluns. The lines include a phase shift element between the two ports of each line. The phase shift element is selected from a transmission line, a delay line, and a phase shifter. Advantageously, the subject lines do not have to be designed for ideal phase shifting and can be designed at near 90° or near λ/4 values.

36 Claims, 25 Drawing Sheets

TUNABLE ACTIVE DIRECTIONAL COUPLERS

CROSS REFERENCE TO RELATED APPLICATION

This application claims the benefit of U.S. Provisional Application Ser. No. 61/498,191, filed Jun. 17, 2011, which is hereby incorporated by reference in its entirety, including all figures, tables and drawings.

BACKGROUND

Directional couplers are essential RF circuits to measure reflected and transmitted RF power. FIG. 1A illustrates a representation of a basic configuration of a directional coupler provided by a single-section coupled line. The coupled line is a result of two transmission lines in proximity to each other; a main line and a coupled line. As shown in FIG. 1A, a pair of coupled lines creates a 4-port device with two planes of reflection symmetry. Following an ideal directional coupled-line coupler and an input at P1, P2 is a through port, P4 is isolated, and P3 is coupled and outputs a signal having 90° phase shift from the signal at the input port P1 (via backward coupling). The single-section coupler is typically implemented in coaxial cable or as a stripline or microstrip to provide a quarter-wavelength ($\lambda/4$) directional coupler.

The assignments of these ports may change for a directional coupler depending on the port used as input and, in some cases, whether the directional coupler is a forward wave coupler or a backward wave coupler.

FIG. 1B illustrates a representation of a basic configuration of a quadrature hybrid directional coupler (e.g., a branch line coupler) where $\lambda/4$ RF transmission lines are used to provide the phase change. Referring to FIG. 1B, an input provided at P1 is isolated at P4 and output with negative phase change at output ports P2 and P3.

FIG. 1C shows a lumped element backward directional coupler, which is based on the conventional parallel coupled line directional coupler. As shown in FIG. 1C a lumped element approach can accomplish similar coupling as the transmission line approach while providing the scalability needed to permit the directional coupler to be used in applications for RFICs (radio frequency integrated circuits) and MMICs (monolithic microwave integrated circuits).

BRIEF SUMMARY

Embodiments of the present invention are directed to active directional couplers. The subject active directional couplers are suitable for RF test applications, including built-in-test applications. In certain embodiments active directional couplers in accordance with the invention are implementable as standalone chips or as part of a system.

According to one embodiment, an active directional coupler is provided, the active directional coupler including a first line providing a first phase change element between a first port at one end of the first line and a second port at the other end of the first line; a second line providing a second phase change element between a third port at one end of the second line and a fourth port at the other end of the second line; a first active directional element connected at a first end to the first line and at a second end to the second line between the first port and the third port; and a second active directional element connected at a third end to the first line and at a fourth end to the second line between the second port and the fourth port. The first and second active directional elements can include one or more active elements such as diodes and transistors. The phase change elements can be implemented as transmission lines, delay lines, or phase shifters. The delay lines and phase shifters can include passive elements such as inductors and capacitors. In certain embodiments, the capacitance for the delay line or phase shifter is accomplished in part or in total by parasitic capacitance in the system.

According to a further embodiment, an active directional coupler in accordance with various embodiments of the invention is tunable. In one embodiment, the tuning of the subject active directional couplers is carried out using varactors connected to the first and second lines in the signal path between ports.

Tunable dual and multiple active directional couplers can be implemented by adding additional lines with ports and directional elements.

In addition, certain embodiments provide 0° and 180° phase differences at outputs of the subject tunable active directional couplers.

BRIEF DESCRIPTION OF THE DRAWINGS

FIG. 16A shows a simulation result with an input signal from 20 GHz to 40 GHz; and FIG. 16B shows the s-parameters for 7 cases of changing the bias conditions of the diodes.

FIG. 18A shows a simulation result of s-parameters where the coupled port has a 3 dB higher output than the through port output; FIG. 18B shows a simulation result of s-parameters where the coupled port output level is similar to the through port output level; FIG. 18C shows a simulation result of s-parameters where the coupled port has a 3 dB lower output than the through port output; FIG. 18D shows the s-parameters for multiple cases of changing the control voltages of varactor diodes; and FIG. 18E shows the s-parameters for multiple cases of changing the bias conditions of the transistors.

FIG. 22A shows measurements of S-parameters in selected bias conditions when coupling gains are 3 dB, 0 dB, −3 dB and −6 dB; FIG. 22B shows measurements of S-parameters in selected bias conditions when coupling gains are 3 dB, 0 dB, −3 dB, and −6 dB, where VP1 and VP3 are bias voltages applied through P1 and P3, respectively; and FIG. 22C shows measurements of S-parameters in a nominal bias condition where varactor control voltages, VC1, VC2, VC3, and VC4, are tuned differently.

DETAILED DISCLOSURE

Active directional couplers are provided that can be embedded in integrated circuits for testing and other applications. According to certain embodiments, the subject couplers are suitable for RF applications, including built-in-test applications. The subject couplers can be manufactured as stand-alone chips or as part of a system.

In accordance with embodiments of the invention, the subject active directional couplers are tunable. For example, voltage controlled elements can be used to adjust and tune the phase of the subject active directional couplers before or during use. In one implementation, a microprocessor or other controller can be programmed to adjust the biasing of the tunable active directional couplers and change the type of directional coupler while in use. In another implementation the tuning is performed to improve coupler performance during testing. Accordingly, certain embodiments of the invention can provide flexibility in on-chip RF testing.

Figure 1A:
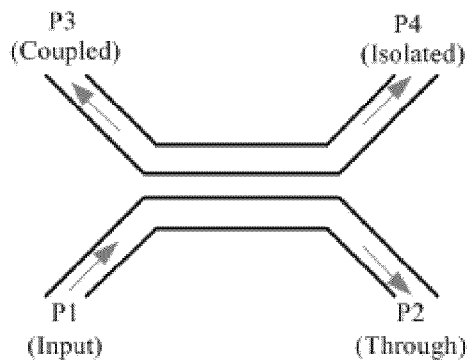
FIG. 1A shows a representation of a single-section coupled line coupler.
Figure 1B:
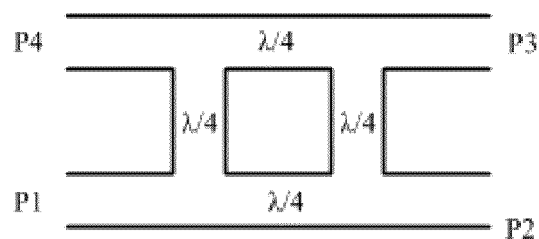
FIG. 1B shows a representation of a quadrature (90°) hybrid coupler.
Figure 1C:
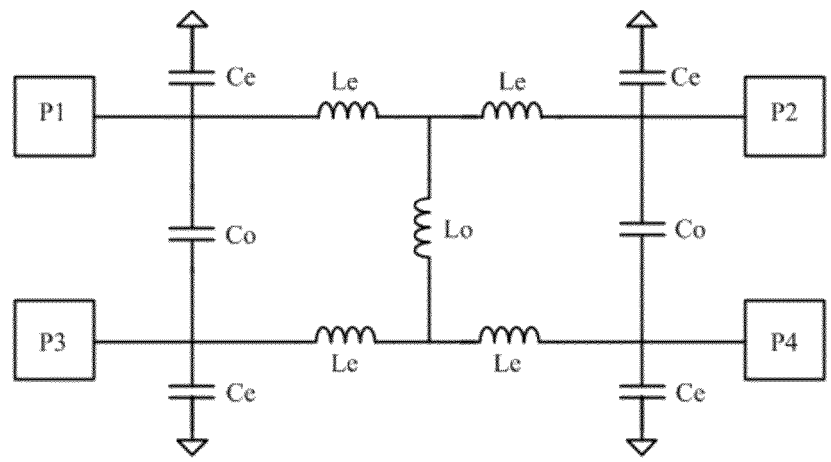
FIG. 1C shows a representation of a lumped element backward directional coupler.
Figure 2:
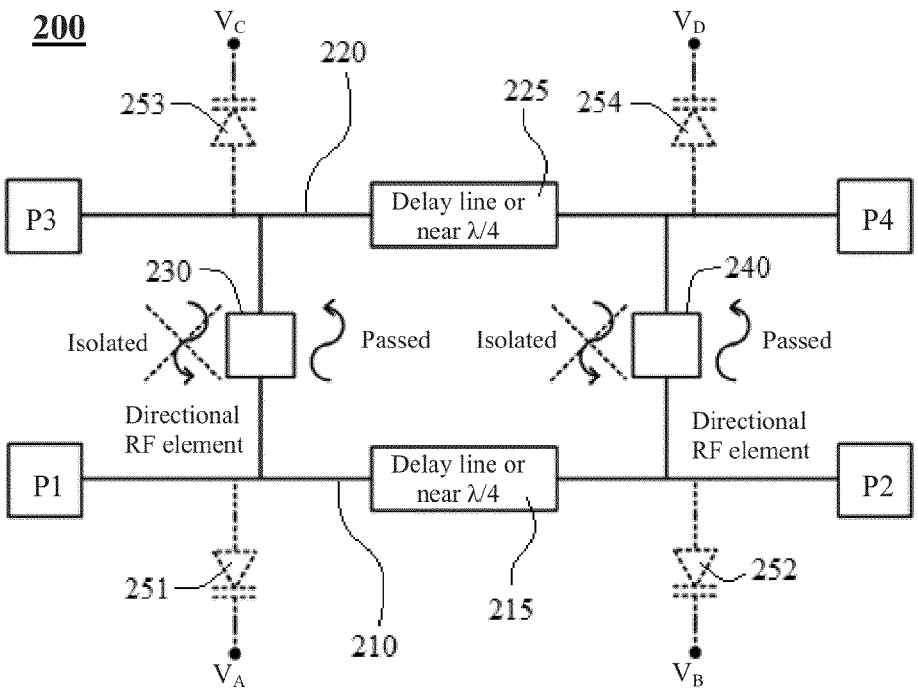
FIG. 2 shows a block diagram of a tunable active directional coupler in accordance with an embodiment of the invention.

Referring to FIG. 2, an active directional coupler 200 can include two lines (210, 220) with phase change elements (215, 225), and directional elements (230, 240) connecting the two lines (210, 220) before and after the phase change elements.

As used herein the term "line" refers to a metallic conductive signal path and is not necessarily along a single plane or in a linear physical configuration.

The phase change elements (215, 225) can be, for example, 90° shifters or λ/4 RF transmission lines. In addition, instead of 90° shifters and λ/4 RF transmission lines, embodiments of the subject tunable active directional coupler adopt "near" 90° phase shifters or delay lines and "near" λ/4 transmission lines to add approximately 90° phase change between P1 and P2 and between P3 and P4. In accordance with embodiments of the invention, the "near" 90° and "near" λ/4 refers to a tolerance of up to (plus or minus) 10%, in certain cases the tolerance is up to (plus or minus) 15% and in other cases the tolerance can be up to (plus or minus) 20%. That is, the phase change elements have a greater capacity for variation of the amount phase shifting than prior or related art directional couplers. In certain embodiments, RF filters can be used to provide the phase change elements (215, 225) of the lines (210, 220). For example, a band pass filter (BPF), a low pass filter (LPF), or a high pass filter (HPF) may be used.

One of the primary characteristics of a directional coupler is its coupling factor, which is defined as: coupling factor $$(dB) = -10\log\frac{P_4}{P_1},$$

where $P_1$ is the input power at the input port P1 and $P_4$ is the output power from the coupled port P4. The coupling gain is then defined as: coupling gain $$(dB) = 10\log\frac{P_4}{P_1}.$$

In one configuration, the directional elements pass waves from P1 or P2, but block waves from P3 or P4 back to P1 or P2. For example, when an input RF signal is input to P1 to output through P2, P3 functions as an isolation port and P4 functions as a coupled port. When an input RF signal passes from P2 to P1, P3 functions as a coupled port and P4 functions as an isolation port.

The terminations at each port are not shown in the diagrams of the directional couplers described herein. However, it can be understood that the ports are terminated in an appropriate fashion. In addition, internal biasing circuits are not shown in the drawings. However, it can be understood that any suitable biasing can be used for the active elements.

In further embodiments, the subject active directional couplers can be extended to use multiple outputs. Multiple directional RF elements and lines with phase delay elements can be included in addition to the two lines shown in FIG. 2 in order to provide multiple outputs for an active directional coupler.

In accordance with embodiments of the invention, not only is an active directional coupler provided, but the active directional coupler is made tunable. In accordance with certain embodiments of the invention, varactor diodes (shown dotted in the drawings) are connected for tuning of the active directional coupler. One or more varactors can be provided for each line. For example, as shown in FIG. 2, two varactor diodes 251, 252 can be connected to the first line 210, one at each side of the phase change element 215; and two varactors can be connected to the second line 220, one at each side of the phase change element 225.

In certain embodiments, the tuning may be utilized for only one of the lines of the active directional coupler. In addition, although the drawings indicate that the varactors are connected to each line at their anodes, in certain embodiments one or more of the varactors can be connected along the signal path at the their cathodes.

For the tuning varactors of certain embodiments of the invention, tunable capacitors are connected to the p and n junction of diodes to form the tuning varactors. Although varactors are shown, embodiments are not limited thereto. In particular, FETs, BJTs, diodes, and tunable RF MEMs can be employed for the tuning purpose instead of, or in addition to, the varactors.

The tunable frequency range is an important decision factor for the maximum and minimum capacitance variations of tunable elements. Over wideband frequencies, as designers achieve a larger tuning range, the maximum capacitance of tunable elements gets larger. Then, the maximum operating frequency gets lower because the minimum capacitance of tunable elements tends to increase, causing the minimum total capacitance at the node to get larger. If designers want to achieve a fine tuning range, the minimum capacitance does not significantly affect the total capacitance of the node and the directional couplers tend to operate at higher frequencies. The subject tuning schemes can compensate unwanted RF frequency characteristic changes by process variations, and can enable the subject active directional couplers to provide different RF characteristics such as matching, coupling factor, isolation, and center frequency.

In one embodiment, the directional RF elements (e.g., 230 and 240 in FIG. 2) are implemented as RF isolators or circulators. The isolators and circulators are provided in the form of passive elements. When the direction element is a circulator, since the direction of the signal can be changed, P3 and P4 can be used as input-thru ports depending on a control input for the circulators.

Figure 3A:
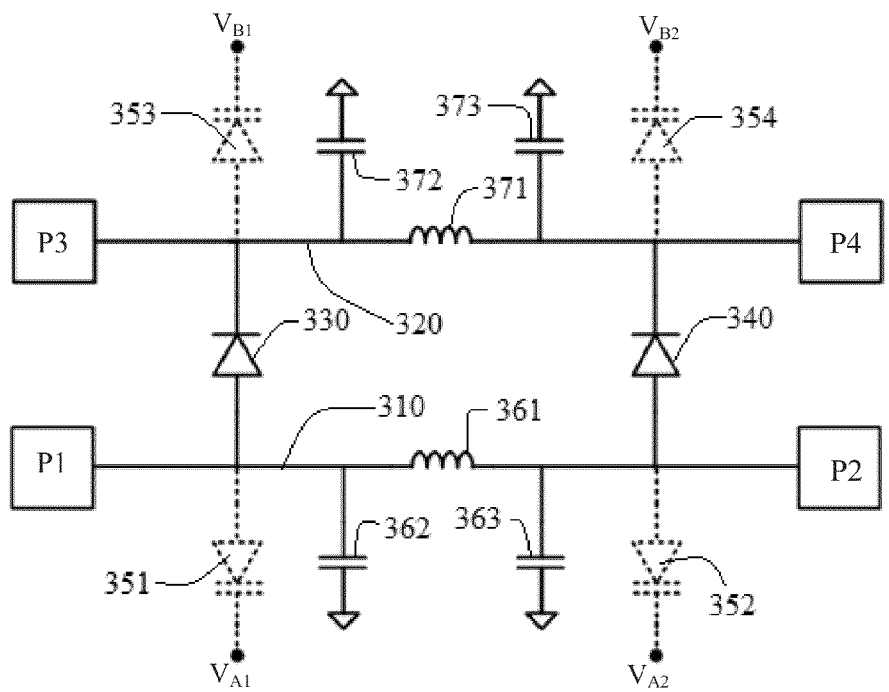
FIGS. 3A-3C show circuit diagrams of a tunable active directional coupler using diodes as the directional element in accordance with certain embodiments of the invention.
Figure 3B:
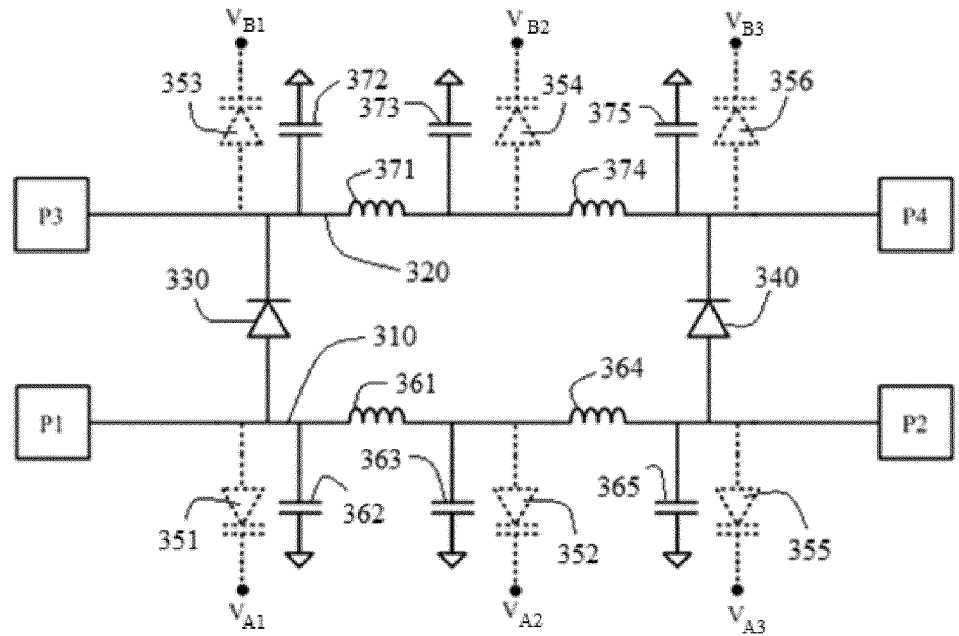
Figure 3C:
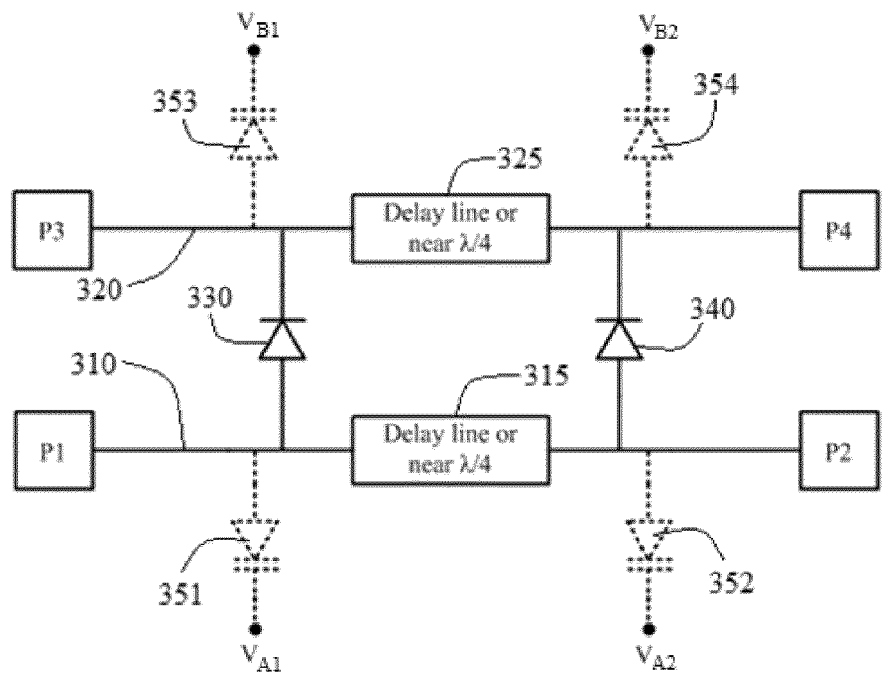

According to another embodiment, the directional elements (e.g., 230 and 240 in FIG. 2) are implemented as diodes. For example, FIGS. 3A-3C illustrate active directional couplers in accordance with certain diode-based directional element embodiments. For the implementations shown in FIGS. 3A-3C, a diode (330, 340) is used for each of the directional elements between P1 and P3 and P2 and P4.

Bias schemes of the diodes are not shown. However, the biasing can be accomplished in any suitable manner. As two examples, a bias DC voltage can be directly applied to the P node of the diodes using a coil or inductor, or DC voltage can be directly applied to diodes. By setting different bias voltages, the active directional coupler can tune its dynamic range and coupling gain.

In addition, the coupling factor or coupling gain of the subject active directional couplers is dependent on the transconductance of the coupler. Here, the transconductance of a diode depends on its size. Therefore, by sizing the diodes forming the directional elements of the subject active directional coupler properly, the active directional coupler can become a hybrid coupler, where the hybrid is the special case of a directional coupler having the same output amplitudes for the through port P2 and the coupled port P4.

FIGS. 3A and 3B show two implementations for a phase shifter-based line providing a near/approximate 90° phase change; and FIG. 3C illustrates an embodiment using a distributed model of a delay line or λ/4 transmission line to provide the near/approximate 90° phase change. In FIG. 3C, the line 310 between P1 and P2 includes the distributed model of the delay line or λ/4 transmission line 315 and the line 320 between P3 and P4 includes the distributed model of the delay line or λ/4 transmission line 325.

For one implementation, such as shown in FIG. 3A, each phase shifter line includes one inductor and two capacitors. The line 310 between P1 and P2 includes one inductor 361 and two capacitors 362, 363 and the line 320 between P3 and P4 includes one inductor 371 and two capacitors 372, 373. One diode 330 connects the two lines 310 and 320 at one side of the inductors 361 and 371 and another diode 340 connects the two lines 310 and 320 at the other side of the inductors 361 and 371.

For the embodiment shown in FIG. 3B, a higher order phase shifting delay line is provided where the line includes two inductors and three capacitors. Here, the line 310 between P1 and P2 includes two inductors 361, 364 and three capacitors 362, 363, 365 and the line 320 between P3 and P4 includes two inductors 371, 374 and three capacitors 372, 373, 375. One diode 330 connects the two lines 310 and 320 at one side of the inductors 361 and 371 and another diode 340 connects the two lines 310 and 320 at a side of the inductors 364 and 374 farthest from the inductors 361 and 371. Of course, the higher order is not limited thereto and can include additional inductors and capacitors.

The capacitors for the phase shifter/delay line (362, 363 and 372, 373 in FIG. 3A and 362, 363, 365 and 372, 373, 375 in FIG. 3B) represent total capacitance including parasitic capacitance. Therefore, the capacitors shown as part of the shifter/delay line can be implemented as a discrete or physical component. In addition, the capacitors can be attributable partially or entirely to parasitic capacitance. In one embodiment, the capacitors of the phase shifter or delay line can be entirely provided by parasitic capacitors. For example, the circuit can be designed to meet a particular capacitance from the pads, diodes, and varactor diodes (used for tuning) to establish the capacitance for the capacitors of the phase shifter/delay line.

It should be noted that the capacitances of the capacitors on the line may be unequal. That is, certain embodiments of the invention permit the values of the capacitors to be different from each other. For example, because a MOS transistor has a different gate capacitance than drain capacitance, when a MOS transistor is used for the directional element (discussed in more detail with respect to FIGS. 5-7), capacitors for the lines may be different. An extra capacitor can be placed at the drain node of the transistor to balance the input-through RF line (e.g., P1 to P2) and the isolation-coupled RF line (e.g., P3 to P4). Although the isolation-coupled RF line would appear to have a different value of a capacitor than the input-thru RF line, the ultimate result is a more balanced coupler.

As previously explained, an ideal phase delay provides a 90° phase shift at a particular frequency. For the 90° phase shift delay lines, providing a particular frequency signal as an input at P1, the RF signals at P4 are constructive and the RF signals at P3 are deconstructive, thereby causing P4 to function as a coupled port and P3 to function as an isolated port. However, in accordance with embodiments of the invention, the phase shifter does not need to provide an exact 90° phase shift. Indeed, the isolation and coupled ports work even when the phase shift is not equal to 90°. In addition, even when 90° phase shifters are designed into the circuit, because of the extra parasitic capacitance such as from diodes, varactors, pads, and other elements of the circuit, the phase shift may not stay at 90°.

Advantageously, the subject circuit can obtain satisfactory constructive and deconstructive functions even when using non 90° phase shifter elements or by using phase shifter providing "near" 90° phase shift elements.

The ability to function when using non or near 90° phase shift elements enables the subject tunable active device to have the tuning elements incorporated on the line—as opposed to being provided separate from the signal path. For example, a tunable element such as a varactor diode can be incorporated on the line to change the phase shift in the input-thru RF line and isolation-coupled RF line. In addition to the varying capacitance of the design of the phase shifting delay line as discussed above, these tunable elements vary in matching as well. In accordance with embodiments of the invention, the tunable elements make it possible for designers, test engineers, or control programs choose the optimum status of matching, isolation, coupled gain, and center frequency based on their respective interests.

As shown in FIGS. 3A and 3B, the active directional couplers can include different numbers of varactor diodes to provide tuning FIG. 3A (and FIG. 3C) shows a total of four varactor diodes on the lines; two (varactors 351, 352) are on the input-thru line 310 and two (varactors 353, 354) are on the isolation-coupled line 320. FIG. 3B shows six varactor diodes on the lines; three (varactors 351, 352, 355) are on the input-thru line 310 and three (varactors 353, 354, 356) are on the isolation-coupled line 320.

Placement of the varactors can be established according to the nodes where the directional RF elements and RF delay elements connect. For an embodiment such as shown in FIG. 3B where there are more varactors than RF element connection nodes, the additional varactors can be arranged between delay elements (e.g., between the two inductors for each line).

Figure 4:
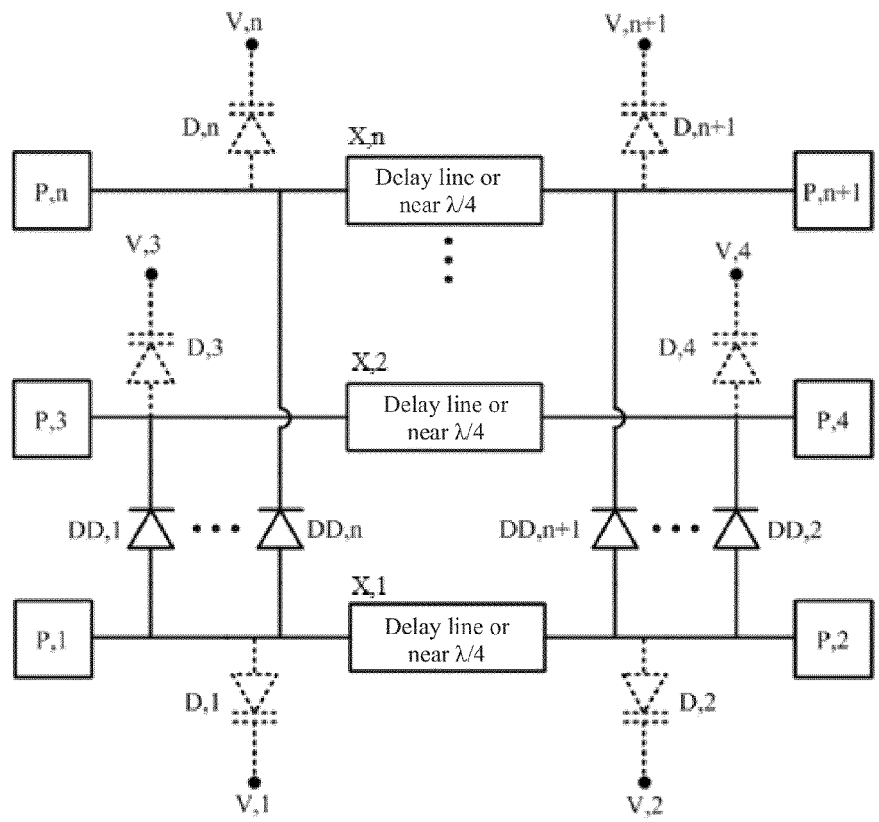
FIG. 4 shows a circuit diagram of a tunable dual and multiple active directional coupler using diodes as the directional element in accordance with an embodiment of the invention.

Dual and multiple active directional couplers can be derived by adding diodes and phase shifters, as shown in FIG. 4. For example, referring to FIG. 4, with a base of a first line for P,1 to P,2 with phase change element X,1, a second line for P,3 to P,4 with phase change element X,2, and a directional element (diodes DD,1 and DD,2 for this case) between the first and second lines, each additional line includes a phase change element X,n such as a shifter, delay line, or transmission line, and two ports P,n and P,n+1. A directional element (e.g., diodes DD,n and DD,n+1 for this case) is included between the first line and each additional line.

As with the previously described embodiments, one or more varactors can be included on at least one of the lines.

FIG. 4 illustrates two varactor diodes for each line (e.g., D,1 and D,2 for the first line; D,3 and D,4 for the second line and D,n and D,n+1 for each additional line), but embodiments are not limited thereto.

The sizes or transconductance of the diodes and phase shifters are not required to be equal. Therefore, the coupler can have different coupling gains, match, isolation, etc. Accordingly, different phase coupled outputs can be provided via the design shown in FIG. 4.

Figure 5:
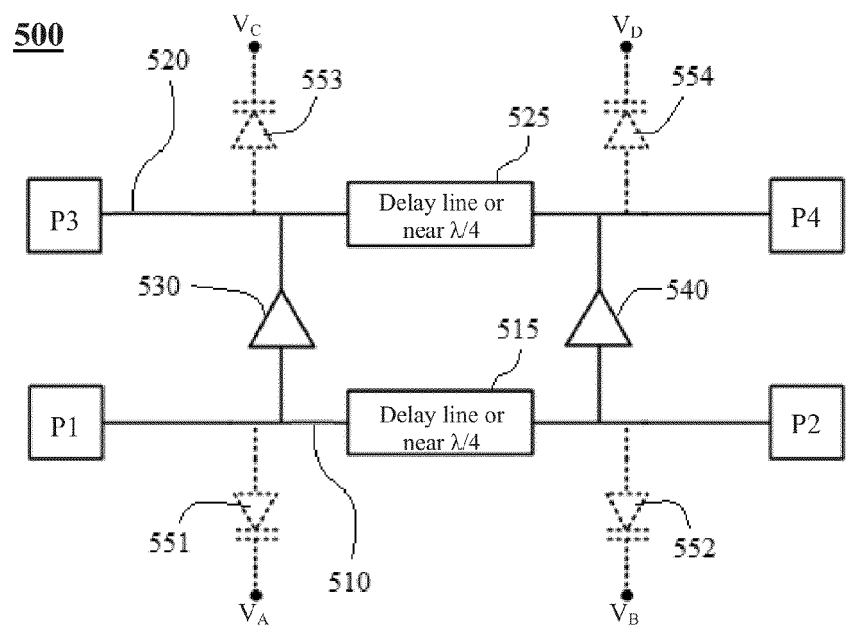
FIG. 5 shows block diagram of a tunable active directional coupler in accordance with an embodiment of the invention.

In some designs, a diode does not provide enough coupling gain or coupling factor for a particular active directional coupler application. Accordingly, in certain embodiments, transistors can be used to provide the directional elements. FIG. 5 shows a general transistor-based directional element, tunable active directional coupler in accordance with certain embodiments of the invention. Referring to FIG. 5, an active directional coupler 500 can include two lines (510, 520) with phase change elements (515, 525), and transistor-based directional elements (530, 540) connecting the two lines (510, 520) before and after the phase change elements (515, 525).

The transistors can be single transistors or multiple transistors for each directional element (530, 540). In addition, the transistors can provide inverting and non-inverting amplifiers. Furthermore, the gain of the amplifiers can be 1 or greater than 1. In certain embodiments, the two amplifiers can have different gains. Indeed, the gains of the amplifier can be varied by adjusting the transconductance of the transistor(s) (or amplifier). When designing the active directional coupler 500 as a hybrid coupler for a particular application, the transconductance of the two directional elements can be selected such that (for an ideal case)

$$G_{m1} + G_{m2} = \frac{2}{R_L} \quad \text{or} \quad G_{m1} + G_{m2} = \frac{4}{R_L}$$

(depending on input source or port definition), where $G_{m1}$ is the transconductance of the first transistor-based directional element, $G_{m2}$ is the transconductance of the second transistor-based direction element, and $R_L$ is the load resistance at the output pad.

Figure 6:
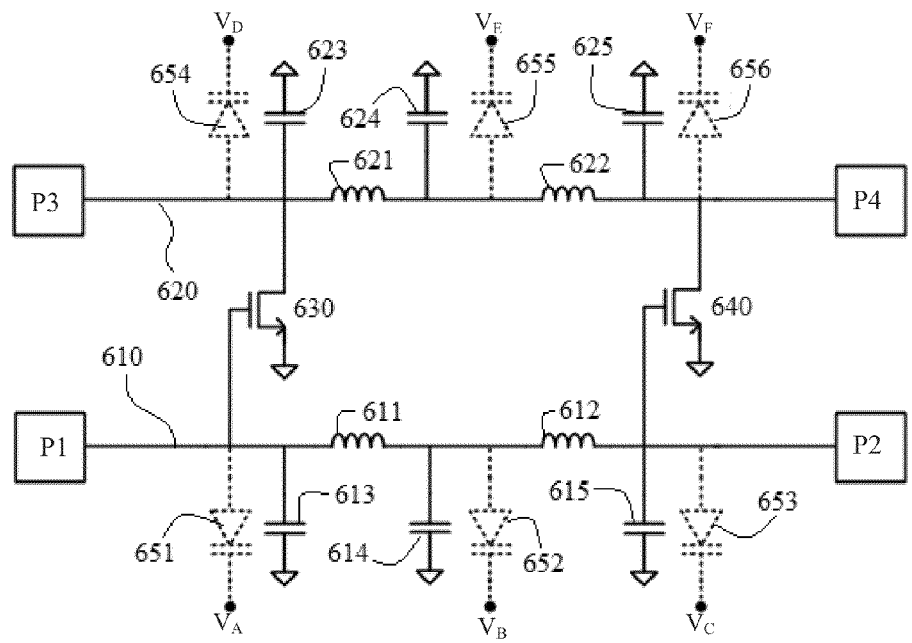
FIG. 6 shows a circuit diagram of a tunable active directional coupler using transistors as the directional element in accordance with an embodiment of the invention.

FIG. 6 shows one example of a tunable active directional coupler using a transistor-based directional element. Common-source amplifiers are used for many amplifiers, and are one of the basic field effect transistor (FET) amplifiers. Referring to FIG. 6 a common source amplifier configuration with two inductors on each line is provided. A first transistor 630 is connected by its gate to the first line at one end of the two inductors 611 and 612 and is connected by its drain to the second line at one end of the two inductors 621 and 622. A second transistor 640 is connected by its gate to the first line at the other end of the two inductors 611 and 612 and is connected by its drain to the second line at the other end of the two inductors 621 and 622. Capacitors 613, 614, and 615 can be provided for the first line 610 and capacitors 623, 624, and 625 can be provided for the second line 620 as parasitic or discrete components. Varactor diodes are attached to provide tuning functions. In the embodiment illustrated in FIG. 6, three varactor diodes are provided for each line (varactor diodes 651, 652, 653 for the first line 610 and varactor diodes 654, 655, 656 for the second line 620).

The tunable active directional coupler can work as an active hybrid coupler when the coupling gain is tuned to provide the same amplitudes for the coupled port and through port. Biasing for the one or more transistors of the transistor-based directional element can be accomplished internally by a biasing circuit (not shown) between the transistor gate and the signal port P1. In other embodiments, biasing may be achieved via ports P3 and P1.

The voltage gain of the common source amplifier is the multiplication of the transconductance and output impedance. Thus, given $gm_A$ as the transconductance of the transistor 630, and gmB as the transconductance of the transistor 640, if the components and lines in FIG. 6 are ideal and lossless and P3 and P4 are respectively terminated by $R_{L3}$ and $R_{L4}$ (and P1 and P2 are terminated by the same impedance), then the voltage gain at P4 can be derived as $(gm_A+gm_B) \cdot (R_{L3}\|R_{L4})$ or $0.5 \cdot (gm_A+gm_B) \cdot (R_{L3}\|R_{L4})$ (depending on input source or port definition). Therefore, each transconductance of the amplifiers takes a role for the total gain of the signals at a coupled port (P4) and the transconductance can be varied using different width-and-length ratios of the transistors or different bias conditions.

Figure 7:
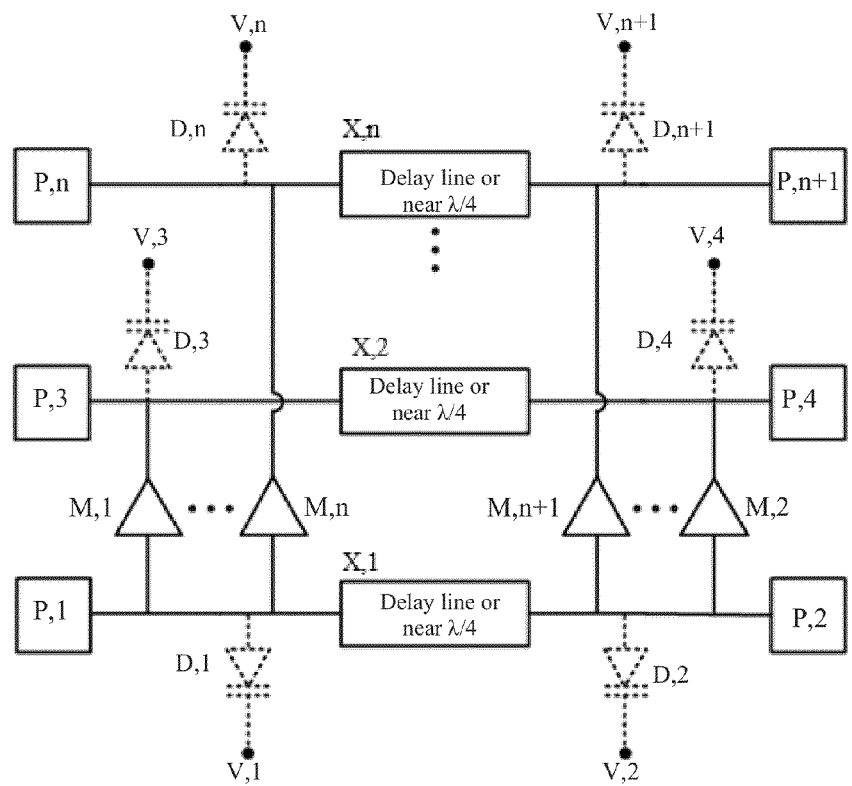
FIG. 7 shows a block diagram of a tunable dual and multiple active directional coupler in accordance with an embodiment of the invention.

Just as with the diode-based designs, dual and multiple active directional couplers using transistors can be derived by adding transistors and phase shifters, such as shown in FIG. 7. The sizes or transconductance of the transistors and phase shifters are not required to be equal. Accordingly, the coupler can have different coupling gains, match, and isolation, etc. Therefore, the subject directional couplers can have different phase coupled outputs. In addition, the different phase coupled outputs can be achieved by setting different bias conditions for each amplifier.

Referring to FIG. 7, starting with a base of a first line for P,1 to P,2 with phase change element X,1, a second line for P,3 to P,4 with phase change element X,2, and a directional element (transistor based designs M,1 and M,2 for this case) between the first and second lines, each additional line includes a phase change element X,n such as a shifter, delay line, or transmission line, and two ports P,n and P,n+1. A directional element (e.g., transistor based designs M,n and M,n+1 for this case) is included between the first line and each additional line.

As with the previously described embodiments, one or more varactor diodes can be included on at least one of the lines. FIG. 7 illustrates two varactor diodes for each line (e.g., D,1 and D,2 for the first line; D,3 and D,4 for the second line and D,n and D,n+1 for each additional line), but embodiments are not limited thereto.

Figure 8A:
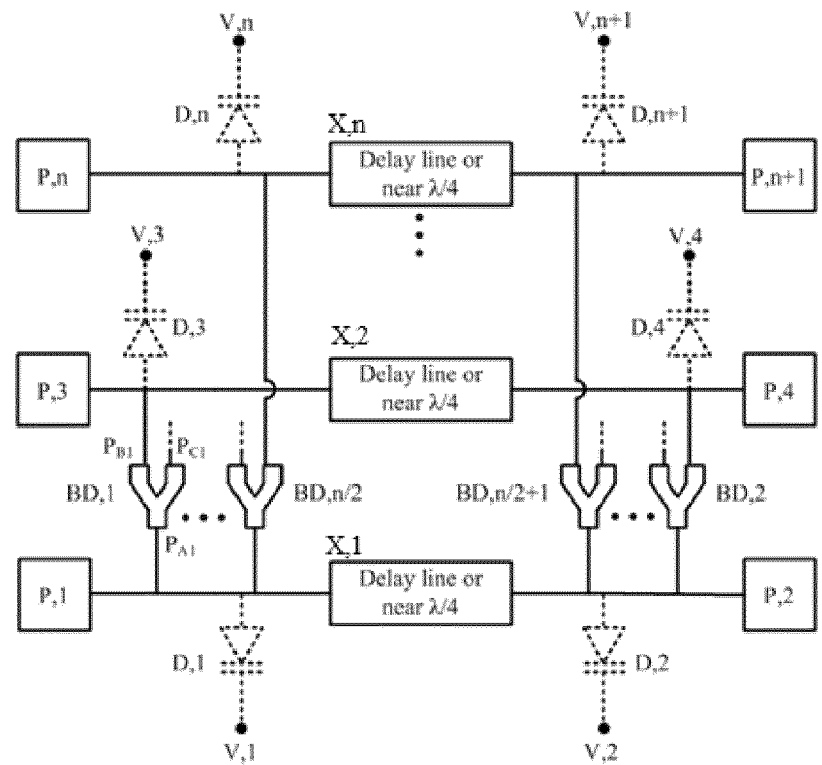
FIGS. 8A and 8B show block diagrams of a tunable dual and multiple active directional coupler using a power divider/balun for the directional elements in accordance with an embodiment of the invention.

FIG. 8A depicts a dual and multiple active directional coupler using power dividers or baluns for the directional element. Referring to FIG. 8A, the directional element (BD,1, BD,2, BD,n/2, BD,n/2+1) using the power divider or balun may include three ports—$P_{A1}$, $P_{B1}$, and $P_{C1}$. In order to properly function as a directional element, the dividers or baluns used in such an embodiment include isolations from $P_{B1}$ to $P_{A1}$ and from $P_{C1}$ to $P_{A1}$. This is different than general dividers or baluns, which do not require such directional isolation. However, this condition can be easily satisfied by using active dividers or active baluns.

Figure 8B:
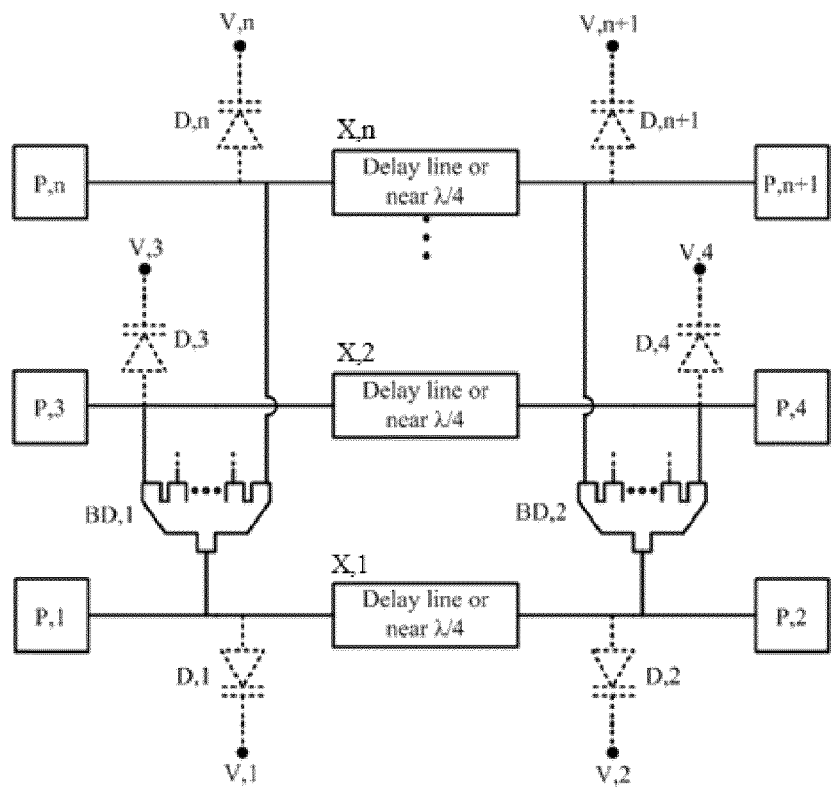

In addition to the active power divider or active balun, a multiple output power divider or "multiple output balun," such as shown in FIG. 8B can be used. This multiple output divider or balun (BD,1n, BD,2n) represents a circuit having a single input and multiple outputs capable of being connected to the multiple lines of the active directional coupler.

The active directional coupler with power divider/balun is designed to provide different phases of each output. For example, the divider in FIG. 8A can provide different phase outputs such as 0°, 45°, and 90°. In certain embodiments, one or more of the coupled outputs of the balun or divider can provide phase outputs that are different from each other (e.g., one is 15° and another is 45°).

In accordance with certain embodiments of the invention, tunable active directional couplers providing a particular phase difference between outputs are provided (e.g., hybrids).

Figure 9:
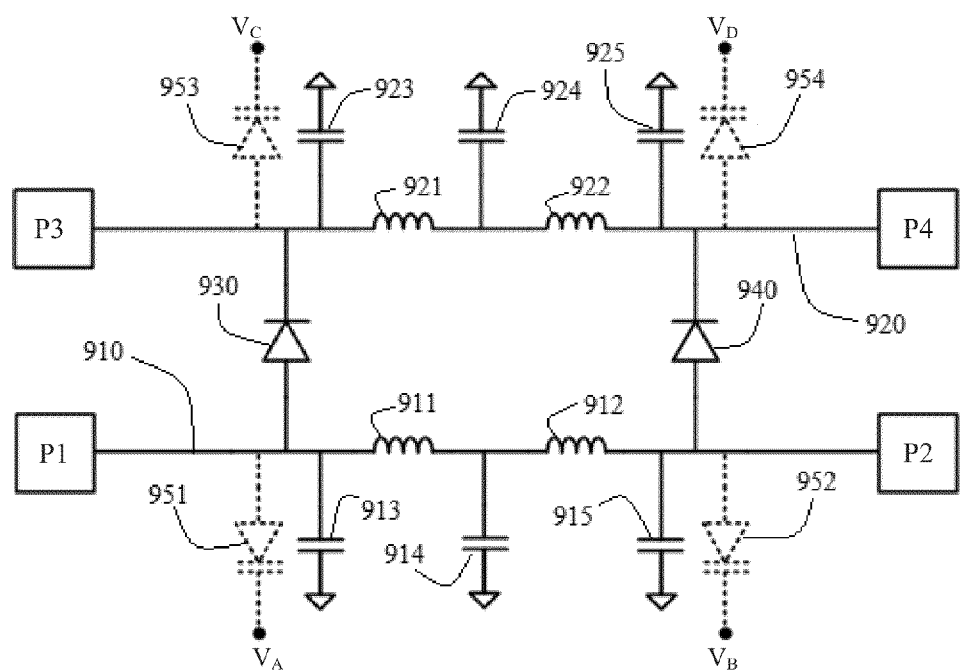
FIG. 9 shows a circuit diagram of a tunable 0° active directional coupler using diodes as the directional element in accordance with an embodiment of the invention.

For example, a tunable 0° active directional coupler can be provided. FIG. 9 illustrates one embodiment of a tunable 0° active directional coupler using diodes as the directional elements. In FIG. 9, each phase shifter line (910, 920) includes two inductors (911, 912 for the first line 910; and 921, 922 for the second line 920) and three capacitors (913, 914, 915 for the first line 910; and 923, 924, 925 for the second line 920) with diodes (930, 940) for the directional elements at each end. Two varactor diodes are shown provided for each line (951, 952 for the first line 910; and 953, 954 for the second line 920).

Figure 10A:
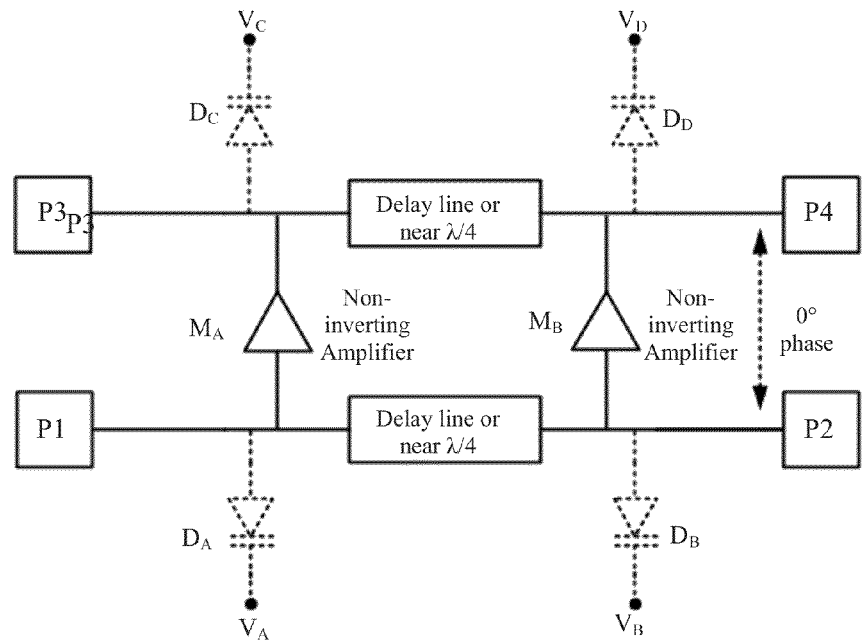
FIG. 10A shows a block diagram of a tunable 0° active directional coupler using a non-inverting amplifier as the directional element in accordance with an embodiment of the invention.
Figure 10B:
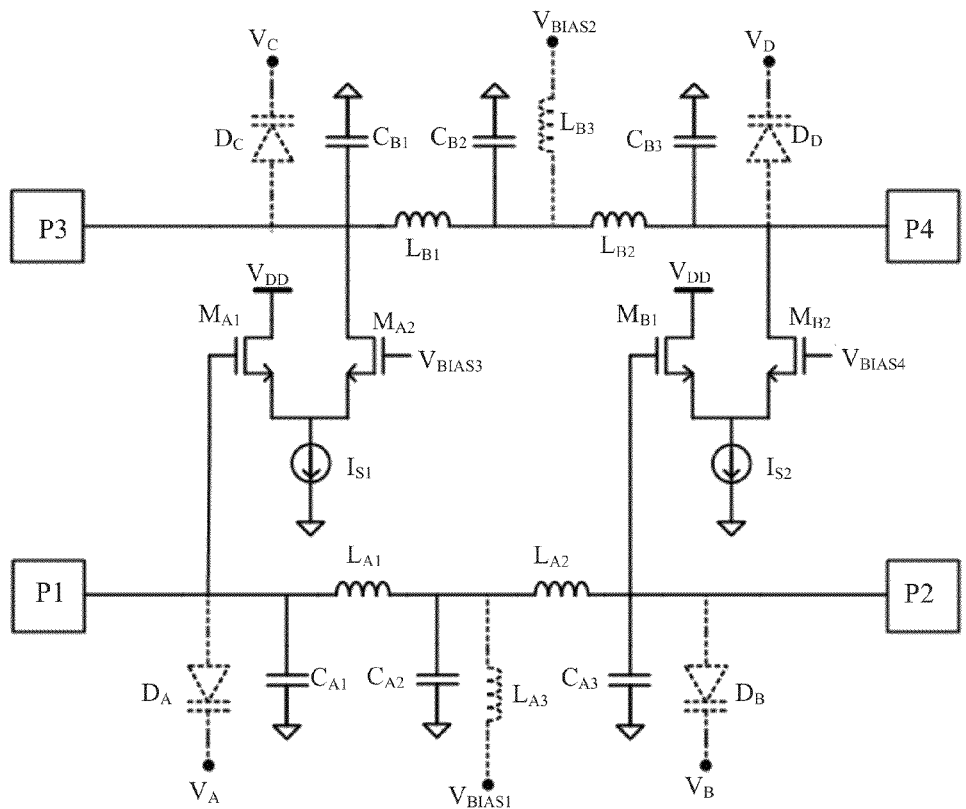
FIG. 10B shows a circuit diagram of a tunable 0° active directional coupler using a non-inverting amplifier in accordance with one embodiment of the invention.

FIG. 10A shows a block diagram of a tunable 0° active directional coupler using non-inverting amplifiers ($M_A$, $M_B$) as the directional elements. In one embodiment, two varactor diodes are provided for each line ($D_A$, $D_B$ and $D_C$, $D_D$). FIG. 10B shows an example circuit of a tunable 0° active directional coupler using non-inverting amplifiers. As shown in FIG. 10B, each phase change line includes two inductors ($L_{A1}$, $L_{A2}$ and $L_{B1}$, $L_{B2}$) with capacitors ($C_{A1}$, $C_{A2}$, $C_{A3}$ and $C_{B1}$, $C_{B2}$, $C_{B3}$) at each end and between the two inductors. In addition, two inductors $L_{A3}$ and $L_{B3}$ are included for gate biasing. These inductors are one approach for biasing and can be omitted when using different biasing methods. There are various ways of tuning coupling gain by setting different bias conditions. According to another embodiment, $I_{S1}$ and $I_{S2}$ can be changed to provide another control method. In certain embodiments, bias circuits can be included to achieve roughly the same biasing of the transistors in each pair of transistors (e.g., a same biasing for $M_{A1}$ and $M_{A2}$ and a same biasing for $M_{B1}$ and $M_{B2}$). For example, the amplifiers should behave well when the bias is within 5-10% (e.g., $V_{bias3}$ at the gate of $M_{A2}$ being within 5-10% of the DC bias at the gate of $M_{A1}$).

Figure 11A:
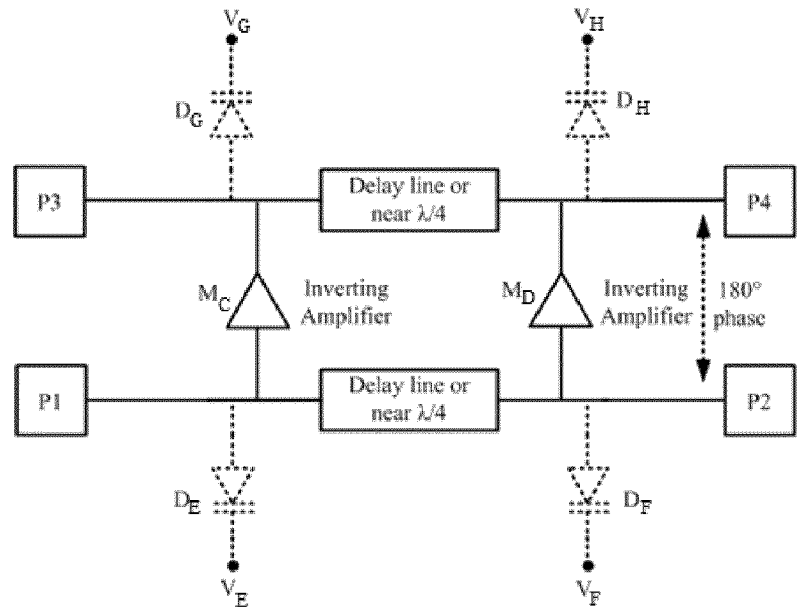
FIG. 11A shows a block diagram of a tunable 180° active directional coupler using an inverting amplifier as the directional element in accordance with an embodiment of the invention.
Figure 11B:
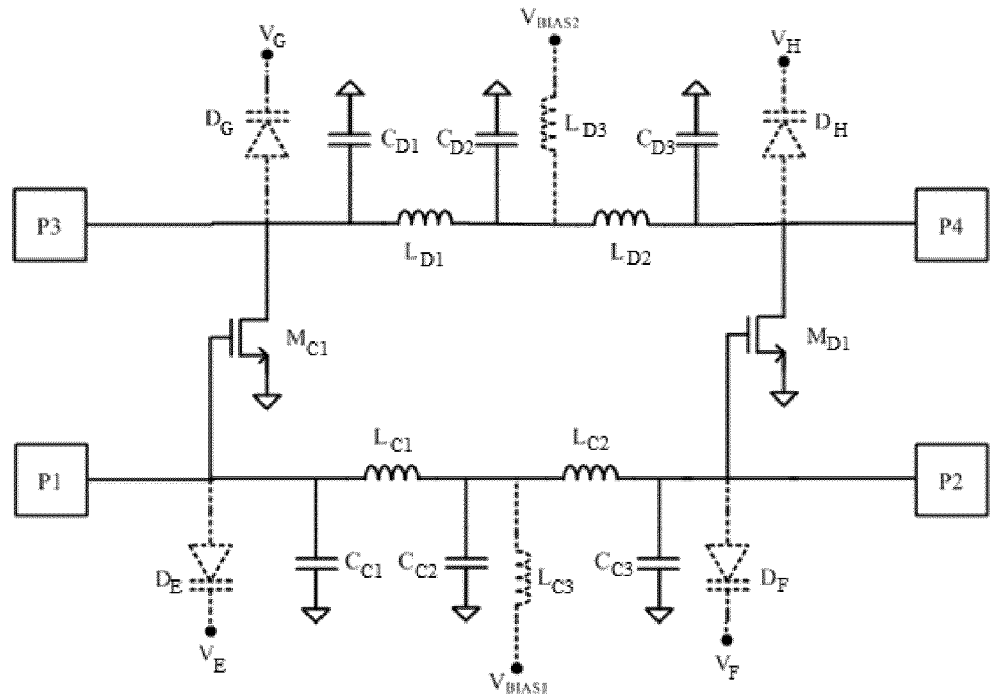
FIG. 11B shows a circuit diagram of a tunable 180° active directional coupler using an inverting amplifier as the directional element in accordance with one embodiment of the invention.

A tunable 180° active directional coupler can also be provided. FIG. 11A shows a block diagram of a tunable 180° active directional coupler using inverting amplifiers $M_C$ and $M_D$ as the directional elements. In one embodiment, two varactor diodes are provided for each line ($D_E$, $D_F$ and $D_G$, $D_H$). An example circuit of a tunable 180° active directional coupler using the inverting amplifiers is shown in FIG. 11B. The inverting amplifier shown in FIG. 11B is implemented using a single transistor ($M_{C1}$ and $M_{D1}$). Similarly as with the non-inverting amplifiers shown in FIG. 10B, inductors can $L_{C3}$ and $L_{D3}$ can be included for the gate bias, and the coupling gain can be tuned by setting different bias conditions.

As previously discussed, tunable dual and multiple active directional couplers can be implemented by adopting embodiments of the invention. FIGS. 12A, 12B, 13A, and 13B provide example embodiments of a tunable dual active directional coupler with a 180° phase difference between outputs.

Figure 12A:
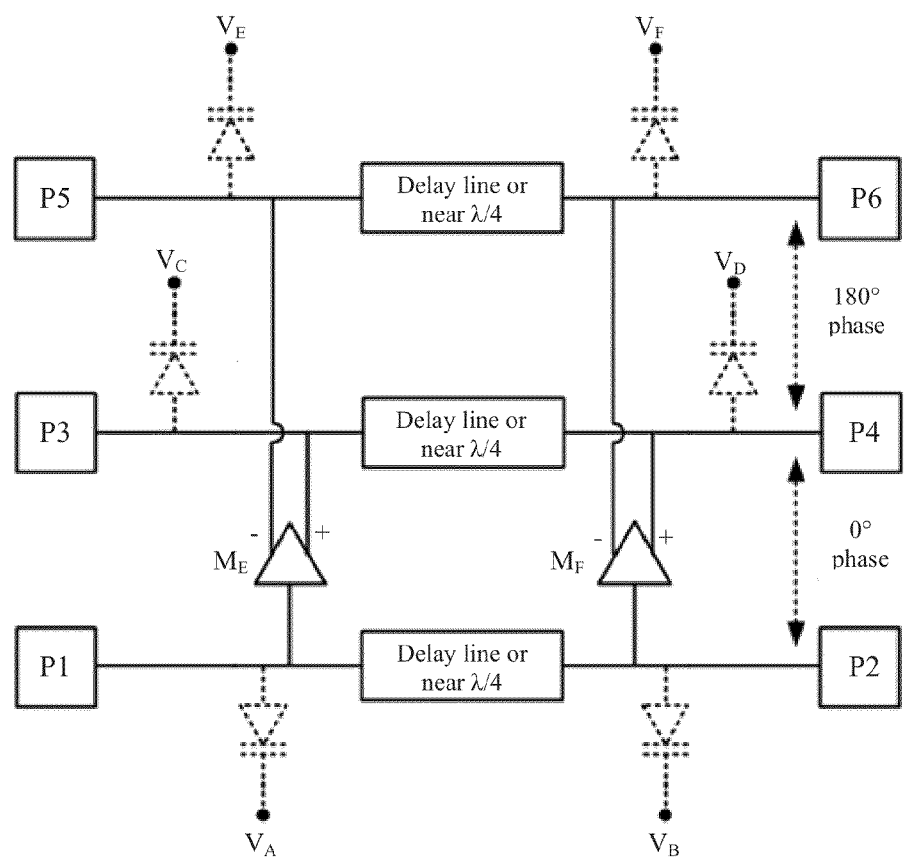
FIG. 12A shows a block diagram of a dual active directional coupler with a 180° difference between the two outputs using a differential amplifier as the directional element in accordance with an embodiment of the invention.
Figure 12B:
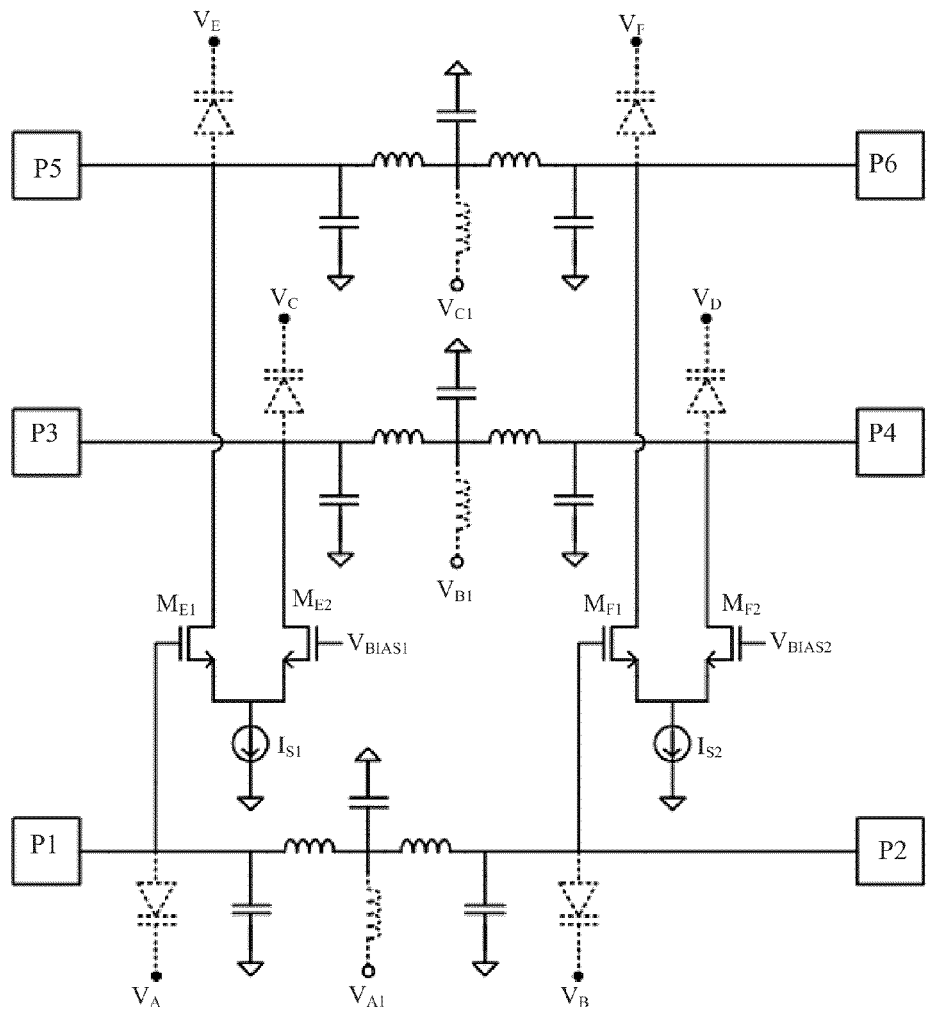
FIG. 12B shows a circuit diagram of a dual active directional coupler with a 180° difference between the two outputs using a differential amplifier as the directional element in accordance with one embodiment of the invention.

FIG. 12A shows one embodiment of a tunable dual active directional coupler with the 180° difference. Referring to FIG. 12A, a single-input, differential-output, differential amplifier having one output connected to one coupled line and a second output connected to another coupler line can provide dual active directional coupler with the 180° difference (e.g., amplifiers $M_E$ and $M_F$). FIG. 12B shows one specific embodiment of such a directional coupler. As shown in FIG. 12B, simple differential output pairs ($M_{E1}$ and $M_{E2}$ for amplifier $M_E$ and $M_{F1}$ and $M_{F2}$ for amplifier $M_F$) can be used to provide a dual active directional coupler with the 180° phase difference.

Figure 13A:
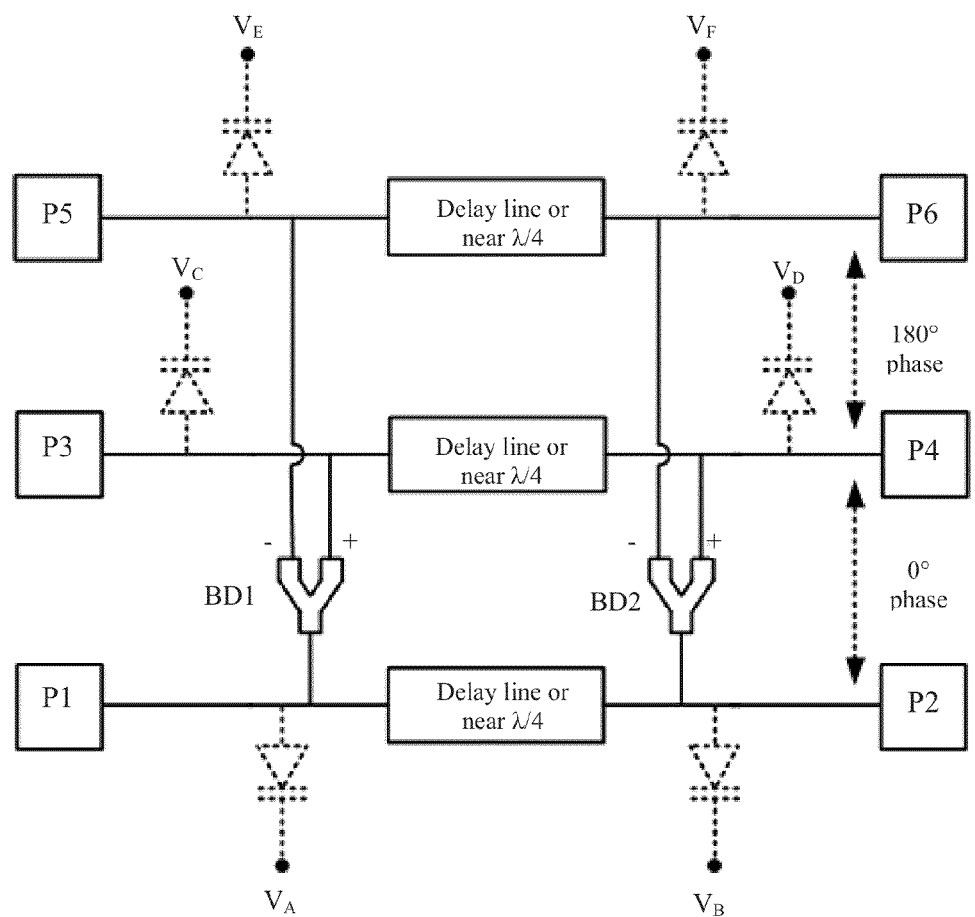
FIG. 13A shows a block diagram of a dual active directional coupler with a 180° difference between the two outputs using an active balun as the directional element in accordance with an embodiment of the invention.
Figure 13B:
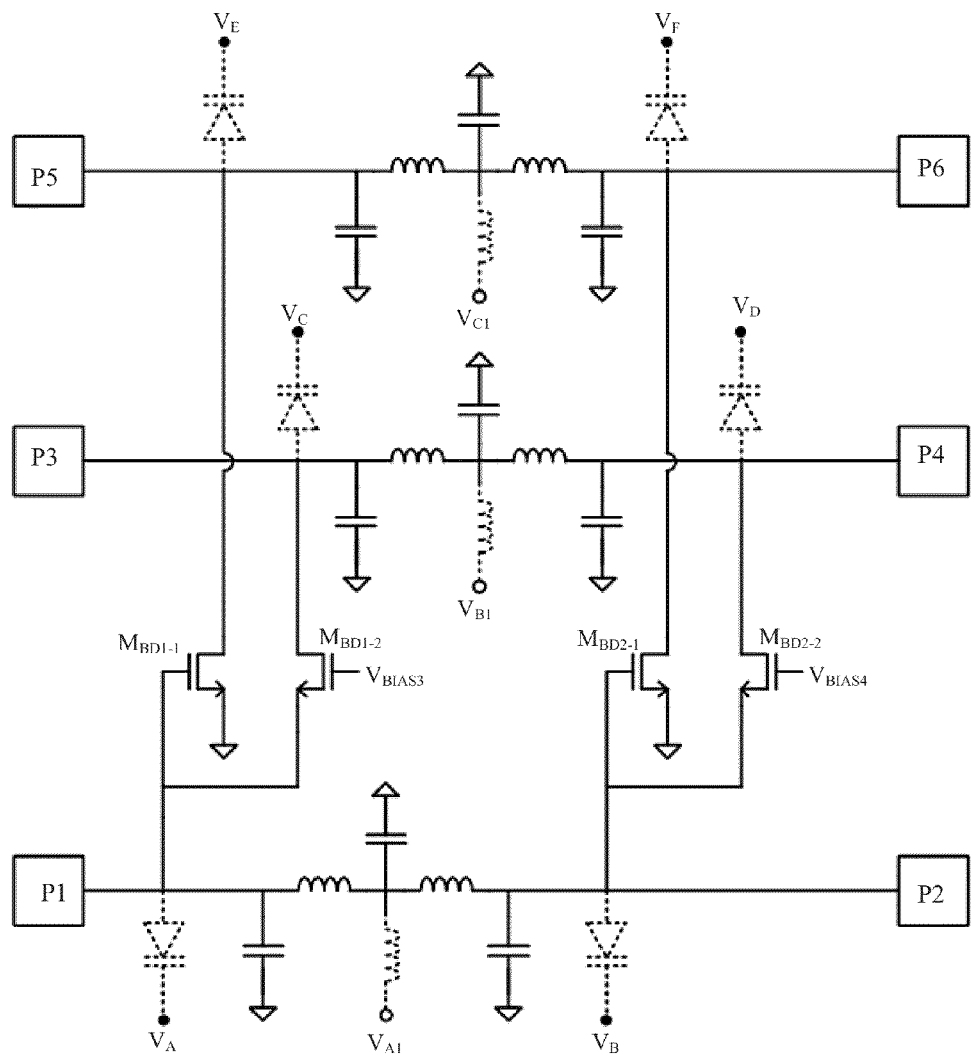
FIG. 13B shows a circuit diagram of a tunable dual active directional coupler with the 180° phase difference using common-source/common-gate FET pair active balun as the directional element in accordance with an embodiment of the invention.

FIG. 13A shows another embodiment of a tunable dual active directional coupler with the 180° difference. Referring to FIG. 13A, dividers or baluns (e.g., BD1, BD2) such as described with respect to FIGS. 8A and 8B can be used. A specific embodiment example of a tunable dual active directional coupler with the 180° phase difference using such a directional element is shown in FIG. 13B. In particular, referring to FIG. 13B, a common-source/common-gate FET pair active balun ($M_{BD1-1}/M_{BD1-2}$, $M_{BD2-1}/M_{BD2-2}$) can be used. In addition, in certain embodiments, bias circuits can be included to achieve roughly the same biasing of the transistors in each pair of transistors (e.g., $M_{BD1-1}$ and $M_{BD1-2}$ of BD1). For example, the amplifiers should behave well when the bias is within 5-10% (e.g., $V_{BIAS4}$ at the gate of $M_{BD1-2}$ being within 5-10% of the DC bias at the gate of $M_{BD1-1}$).

Figure 14A:
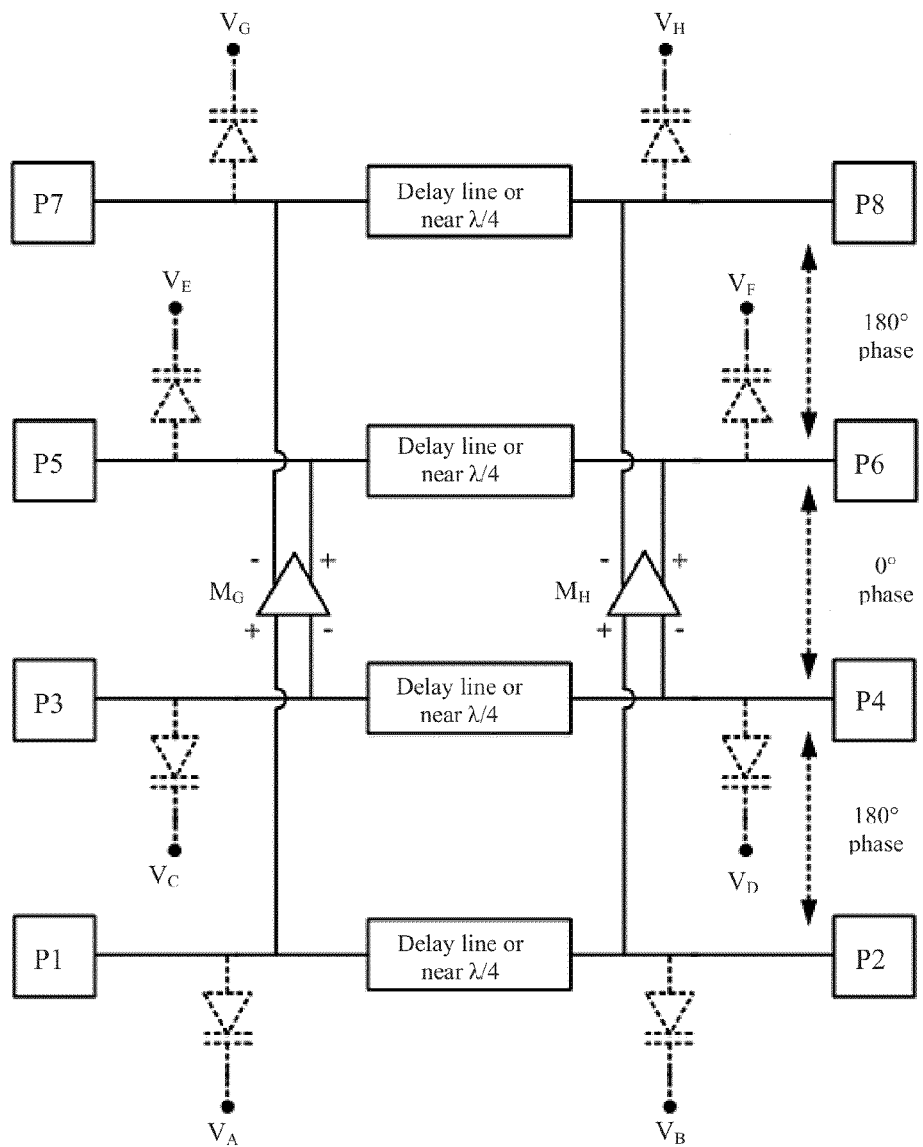
FIG. 14A shows a block diagram of a tunable differential active directional coupler in accordance with an embodiment of the invention.
Figure 14B:
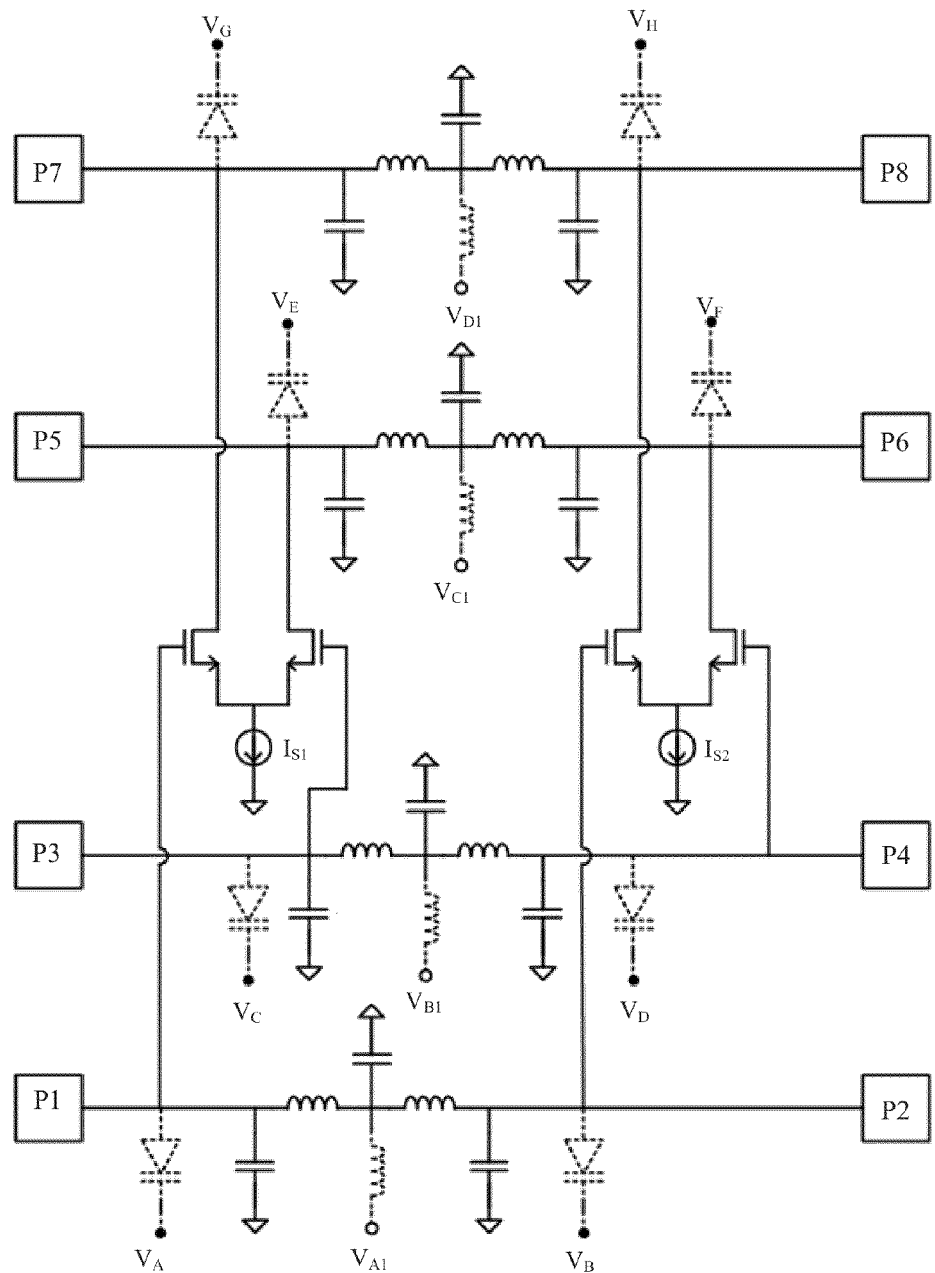
FIG. 14B shows a circuit diagram of a tunable differential active directional coupler according to one embodiment of the invention.

In yet another embodiment, a tunable differential active directional coupler is provided. Referring to FIG. 14A, 0° difference and 180° difference outputs can be achieved by using differential-input, differential-output, differential amplifiers ($M_G$ and $M_H$) as the directional elements. FIG. 14B shows one embodiment of such a coupler. Referring to FIGS. 14A and 14B, 180° phase difference can be provided between P2 and P4, 0° phase difference can be provided between P4 and P6, and 180° phase difference can be provided between P6 and P8. Although not shown, internal bias circuits can be included for providing an appropriate DC bias for the transistors of the amplifiers.

SIMULATION EXAMPLES

Figure 15:
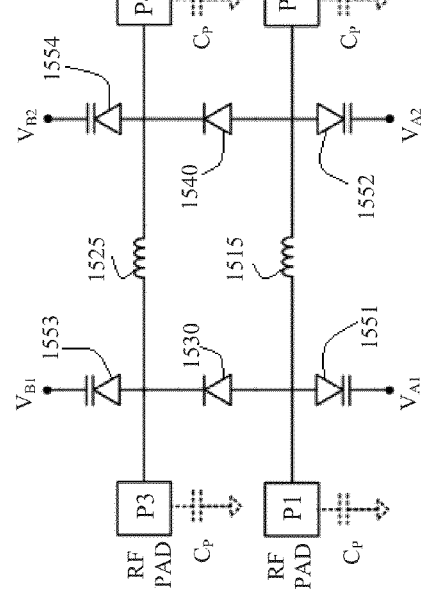
FIG. 15 shows a schematic of a tunable 0° active directional coupler of an embodiment of the invention for use in simulations. $C_P$ is parasitic capacitor of a RF PAD.

FIG. 15 shows a schematic of a tunable 0° active directional coupler using diodes as the directional elements for a simulation example of an embodiment of the invention. Here, discrete capacitors are not included as part of the delay/phase shifting path with the inductors 1515 and 1525 because the parasitic capacitance (noted as $C_P$) from the RF PADs, diodes 1530 and 1540, inductors 1515 and 1525, and other elements (including varactors 1551, 1552, 1553, and 1554) is sufficient enough to bring the required delay. Although a bias circuit is not shown in the schematic, a bias circuit is attached to the RF PADs to permit the diodes 1530 and 1540 to operate in the appropriate region. For tuning, the varactors 1551, 1552, 1553, and 1554 are connected to the line between P1 and P2 and the line between P3 and P4.

Figure 16A:
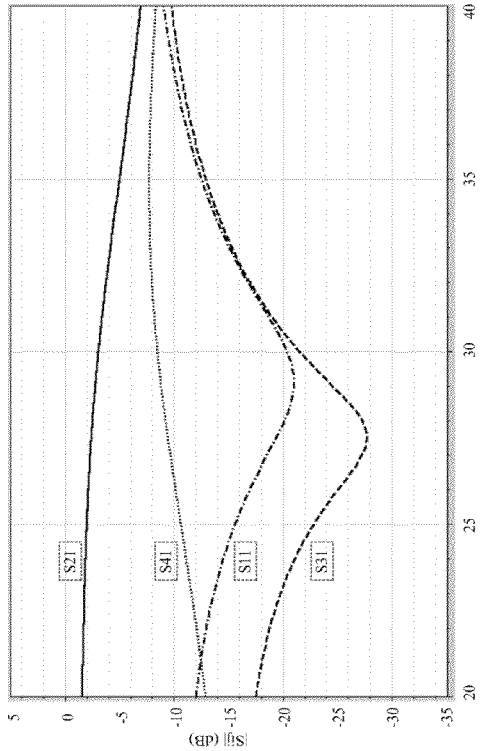
FIGS. 16A and 16B provide simulation results of s-parameters for the tunable 0° active directional coupler of FIG. 15.
Figure 16B:
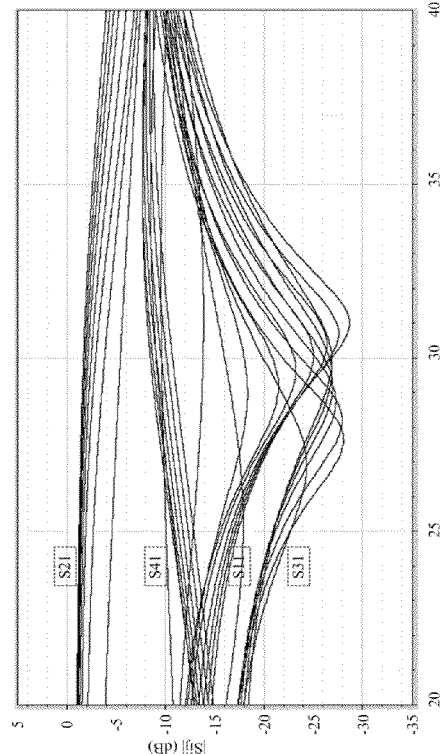

The simulation result of this tunable 0° active directional coupler from 20 GHz to 40 GHz is shown in FIG. 16A. Referring to FIG. 16A, it can be seen that the coupled gain is about −9.3 dB at 27.5 GHz (S41) and the isolation is about −27.8 dB at 27.5 GHz (S31). To illustrate the biasing effect of the directional diodes $D_C$ and $D_D$, bias conditions for these diodes were adjusted and the simulation results are shown in FIG. 16B.

Figure 17:
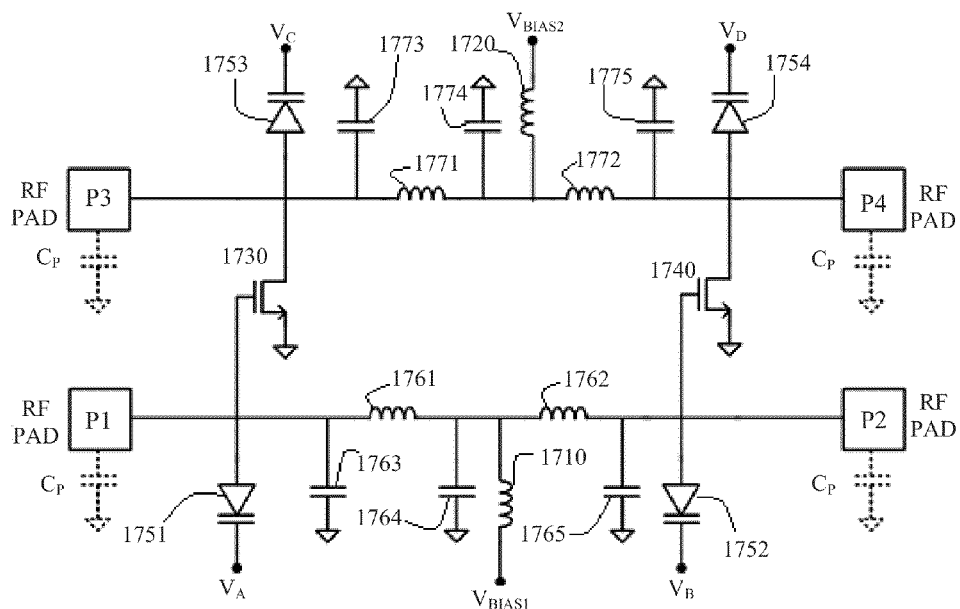
FIG. 17 shows a schematic of a tunable 180° active directional coupler of an embodiment of the invention for use in simulations. $C_P$ is parasitic capacitor of a RF PAD.

FIG. 17 shows a schematic of a tunable 180° active directional coupler using transistors as the directional elements for a simulation example of an embodiment of the invention. Here, inductors 1710 and 1720 are included for biasing the transistors 1730 and 1740. In addition, because the parasitic capacitance $C_P$, alone, is not sufficient, discrete capacitor elements 1763, 1764, 1765, 1773, 1774, and 1775 are included with the inductors 1761, 1762, 1771, and 1772 to provide the appropriate delay across the lines. For tuning, the varactors 1751, 1752, 1753, and 1754 are connected to the line between P1 and P2 and the line between P3 and P4.

Figure 18A:
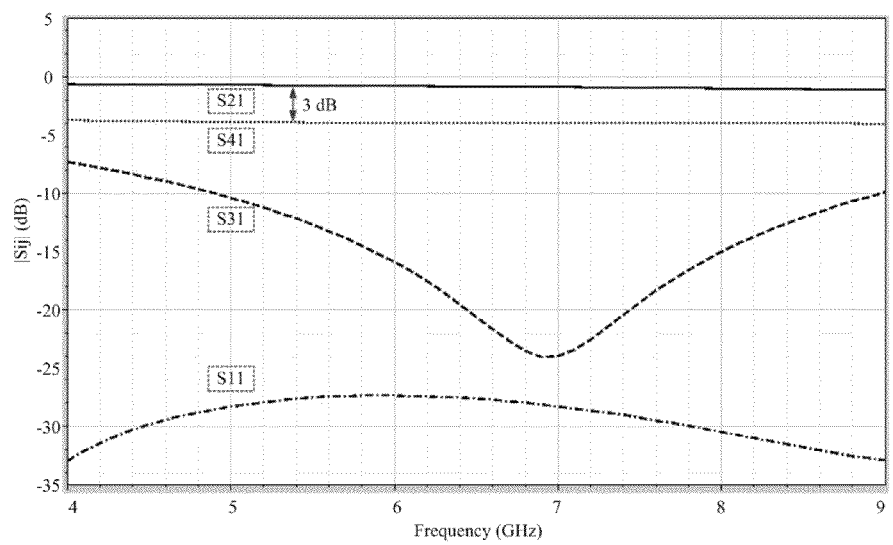
FIGS. 18A-18E provide simulation results for the tunable 180° active directional coupler of FIG. 17.
Figure 18B:
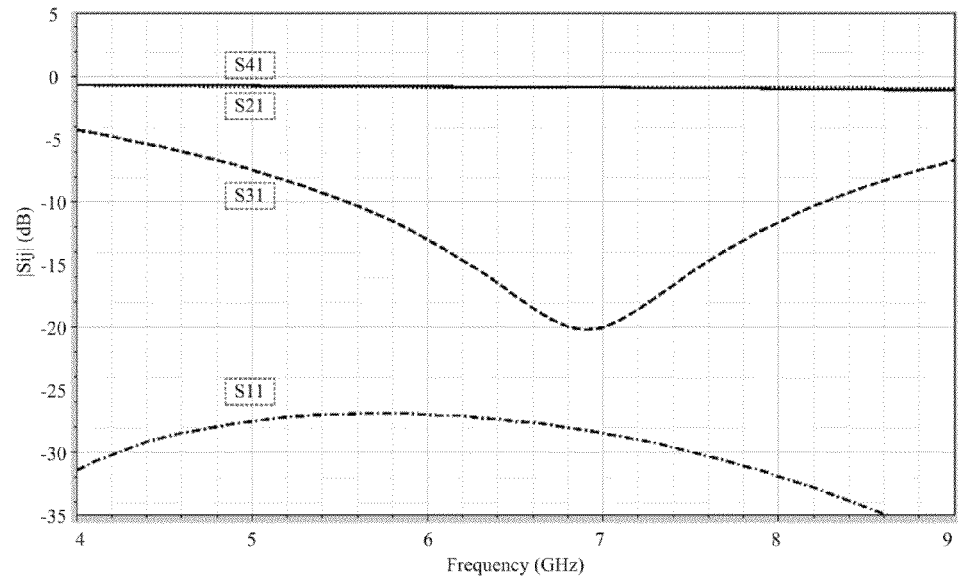
Figure 18C:
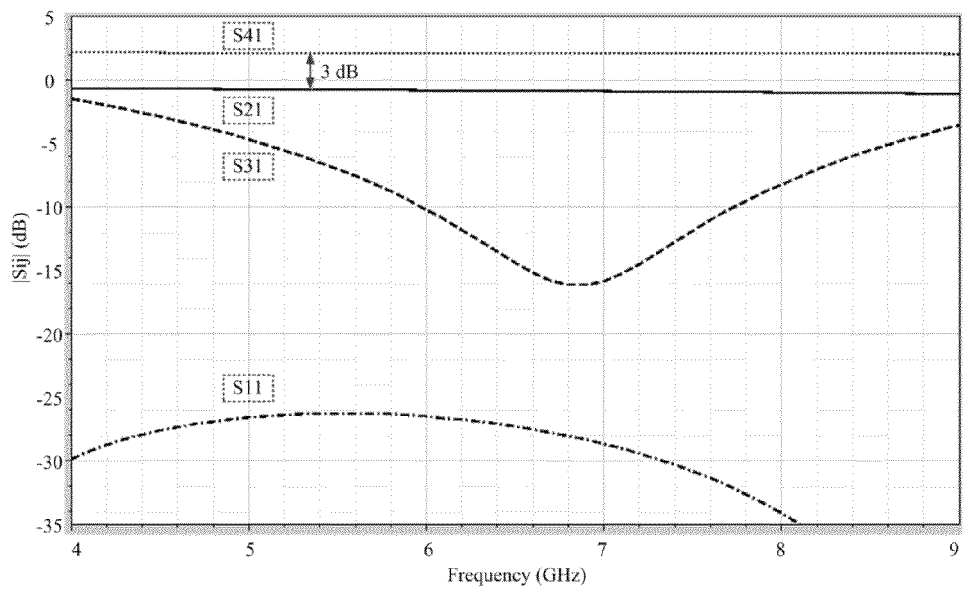
Figure 18D:
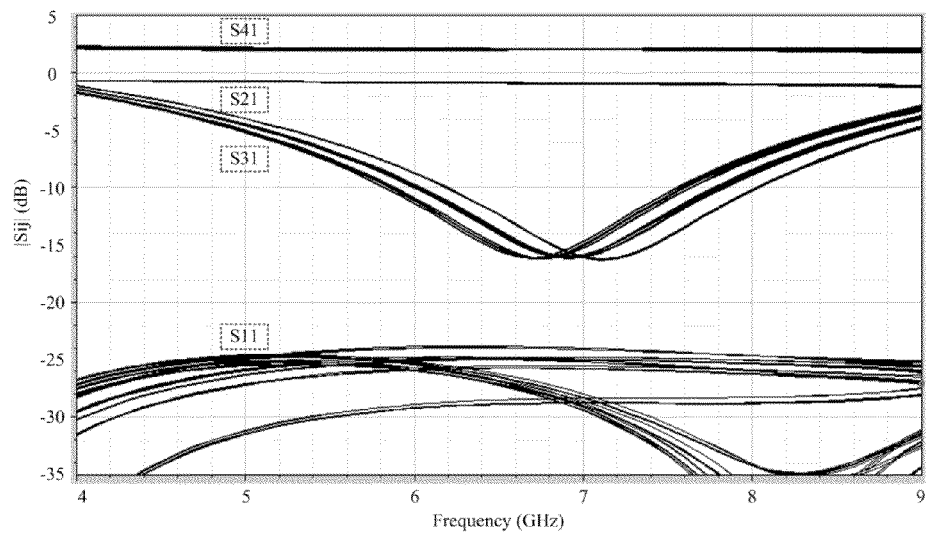
Figure 18E:
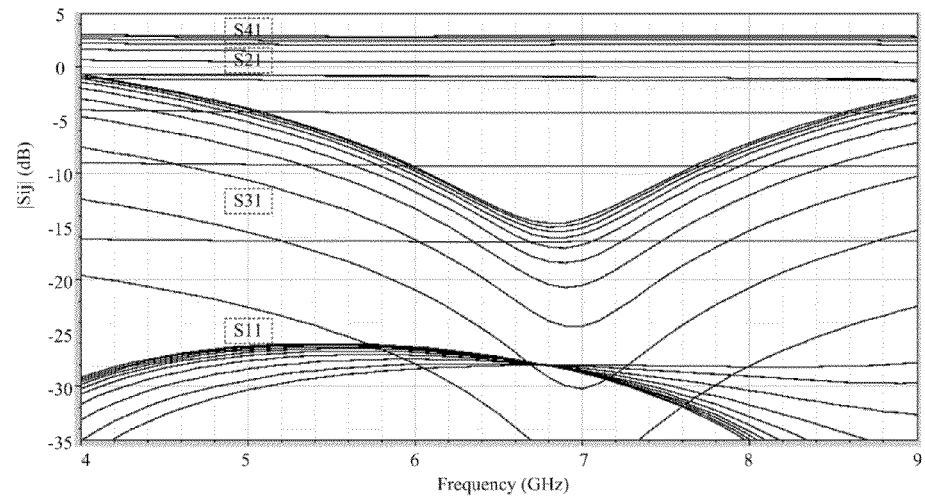

FIG. 18A shows the simulation result of this tunable 180° active directional coupler with a 3 dB higher coupled port output (S41) than thru port output (S21). FIG. 18B shows the simulation result of this tunable 180° active directional coupler with the coupled port output level (S41) and thru port output level (S21) being close. In this case, the coupler functions as tunable 180° Active Hybrid Coupler. FIG. 18C shows the simulation result of this tunable 180° active directional coupler with a 3 dB lower coupled port output (S41) than thru port output (S21). FIG. 18D shows simulation results when the control voltages of the varactor diodes are adjusted. FIG. 18E shows simulation results when the bias conditions of the transistors are adjusted. Accordingly, embodiments of the invention provide tunable active directional couplers that have capabilities for use with RF circuits.

PROTOTYPE EXAMPLES

Figure 19A:
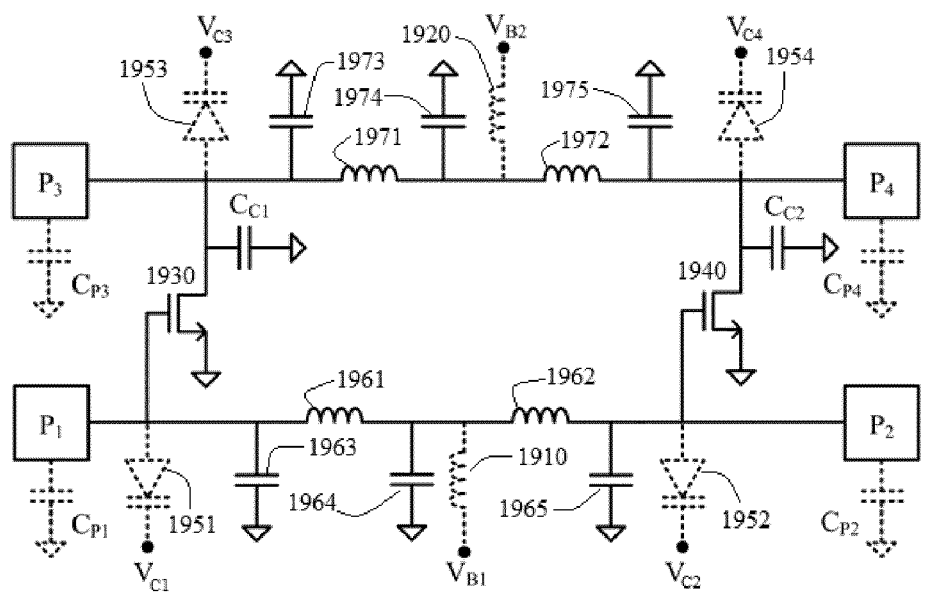
FIG. 19A shows a schematic of a tunable broadband MMIC active directional coupler in accordance with an embodiment of the invention.
Figure 19B:
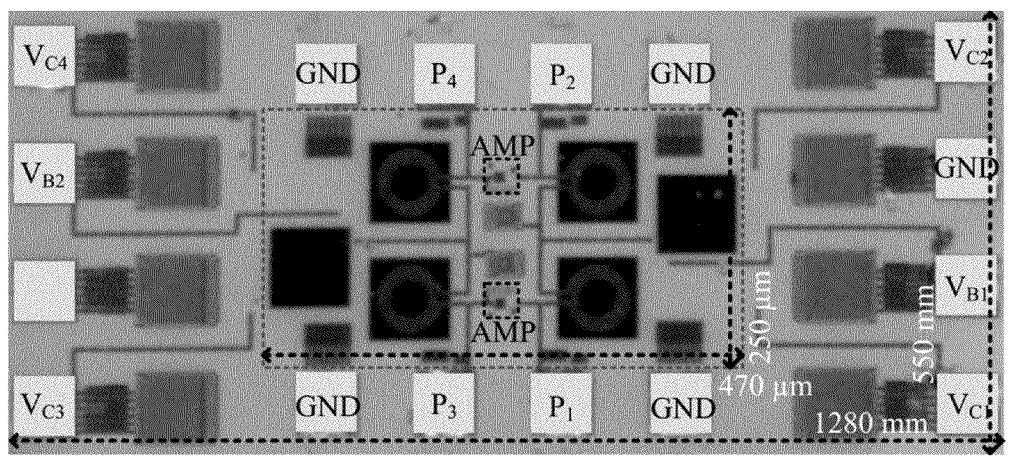
FIG. 19B shows an image with added labels of a chip implementing the tunable broadband MMIC active directional coupler of FIG. 19A using a 130 nm process.

A schematic of the prototype tunable broadband monolithic microwave integrated circuit (MMIC) 180° active directional coupler is shown in FIG. 19A. An image of the fabricated chip is shown in FIG. 19B. The MMIC active directional coupler is designed using a 130-nm BiCMOS process. The chip size is 1280 μm×550 μm. However, the core size of the chip including on-chip DC bias inductors is 470 μm×250 μm excluding RF and DC pads, on-chip DC bypass capacitors, and electrostatic discharge (ESD) protection circuits.

Figure 20A:
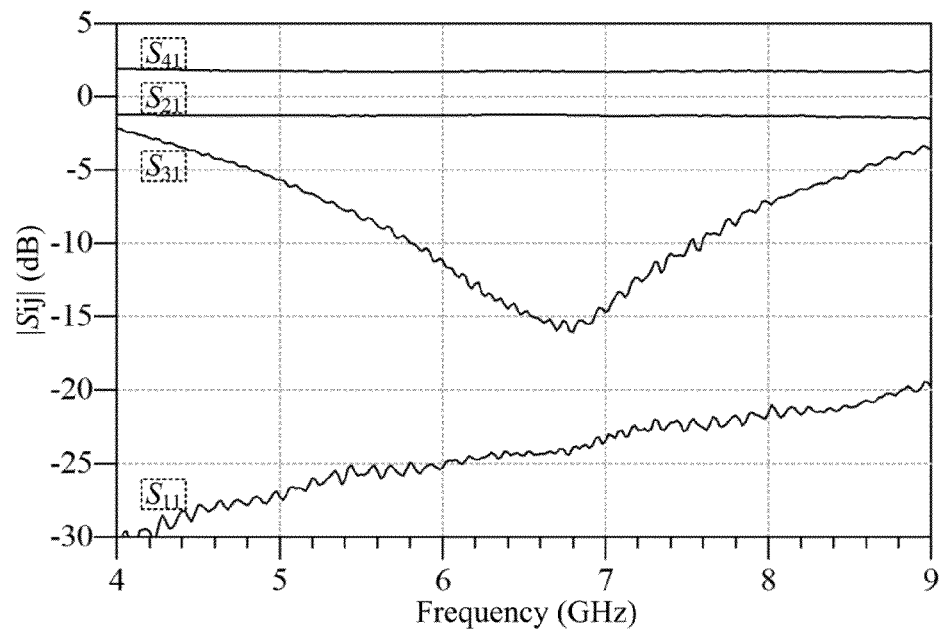
FIGS. 20A and 20B respectively show measured S-parameter results for a 3-dB coupling gain ($V_{B1}$=0.65 V and $V_{B2}$=2.02 V) and measured directivity for a 3-dB coupling gain using the chip shown in FIG. 19B.
Figure 20B:
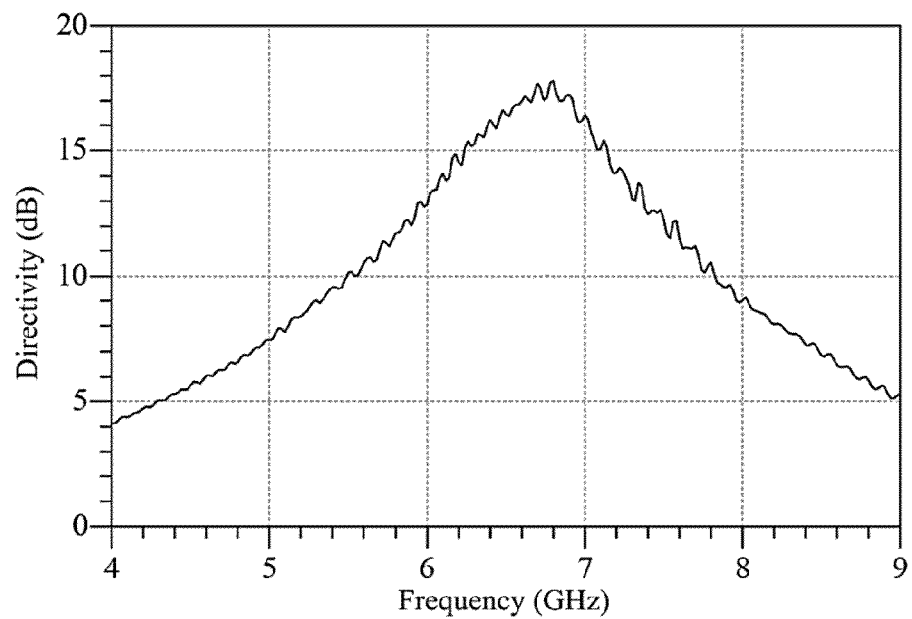

As shown in FIG. 19A, a tunable active directional coupler using transistors (providing an amplifier) as the directional elements is provided. Here, NMOS transistors are used instead of bipolar transistors. However, bipolar transistors can be substituted for, in certain cases, a better performance. As previously described, the transconductance of the amplifiers can be selected by selecting a particular width and length ratio of the transistors 1930 and 1940 used as well as the particular bias conditions. For the prototype, the width and length of the transistors are selected to obtain a 3-dB gain at the coupled port (P4). The gain is tuned by setting different bias conditions of transistors such as the same output at P4 and P2. In this specific condition, the active directional coupler can be said to work as an active hybrid coupler. The measurements in different gain states are shown in FIGS. 20A and 20B (described in more detail below).

Here, inductors 1910 and 1920 are included for biasing the transistors 1930 and 1940. For the prototype design, multi-layer inductors were employed in order to minimize chip area even though the multi-layer inductors tend to have a large loss. For the inductor 1910, there is a negligible voltage drop across the inductor because there is an insignificant current consumption. However for the inductor 1920, the bias current across each transistor 1930 and 1940 is flowing through the inductor 1920. Therefore, a noticeable voltage drop occurs across the inductor 1920. Therefore, as the current consumption gets higher, a higher bias voltage is applied at $V_{B2}$ when using inductors 1910 and 1920. This means that when a bias condition such as $V_{B1}$ is changed, $V_{B2}$ may also need to be modified in order to provide a proper drain voltage level for the amplifiers (in this case, transistors 1930 and 1940).

As an alternative to using the biasing inductors 1910 and 1920, bias voltages can be supplied directly through the ports. For example, the voltage at P1 and P3 (e.g., VP1 and VP3, respectively) can be used to adjust the gains. In this example, the voltage level of VP3 can be fixed while VP1 is adjusted to achieve different gains of the active directional coupler. When implementing this type of biasing for a chip having the biasing inductors 1910 and 1920, the voltage nodes $V_{B1}$ and $V_{B2}$, can be connected to proper bias voltages or can be left open. When the bias voltages are supplied through ports, bias voltages are dependent on the neighbor circuits. Thus, it is a matter of a choice whether users want to apply bias voltages through internal inductors or directly through ports.

In the schematic shown in FIG. 19A, the parasitic capacitors $C_{P1}$, $C_{P2}$, $C_{P3}$, and $C_{P4}$ are provided to represent the parasitic capacitances at each port including the capacitances from RF pads. In this case, because the parasitic capacitances $C_{P1}$, $C_{P2}$, $C_{P3}$, and $C_{P4}$, alone, are not sufficient to provide an appropriate delay across the lines, discrete capacitor elements 1963, 1964, 1965, 1973, 1974, and 1975 are included with the inductors 1961, 1962, 1971, and 1972 to provide the appropriate delay across the lines. In particular, in order to use less chip area, two phase shifters are implemented as two inductors and three capacitors each. This configuration introduces nearly 90° phase delays. Although discrete components are used in the prototype, transmission lines can be used for the phase shifters instead of lumped elements. Transmission lines take less chip area as a targeted frequency gets higher. Therefore, transmission lines for the phase shifters are a rational choice in millimeter wave applications.

Returning to FIG. 19A, there are two capacitors ($C_{C1}$ and $C_{C2}$) connected to transistors 1930 and 1940, respectively. Because the gate capacitance is typically larger than the drain capacitances, the purpose of the capacitors ($C_{C1}$ and $C_{C2}$) at the drain node is to reduce this difference. However, total capacitance at the drain of the transistor 1730 is the sum of the capacitance of $C_{C1}$, capacitor 1973, and other parasitic capacitances. Therefore, larger equivalent values of capacitors 1973 and 1975 can be used other embodiments without using $C_{C1}$ and $C_{C2}$.

The performance of the phase shifters (e.g., the delay line provided by the inductors and capacitors) plays a key role in making a broadband tunable active directional coupler. The frequency range is set by the phase tolerance from the 90° phase delay. The better the phase tolerance, the broader the tunable active directional coupler becomes (in terms of bandwidth). The better the phase tolerance in the phase shifters, the more broadband frequency operations are achievable in a tunable active directional coupler. For the tunable active directional couplers of various embodiments of the invention, the coupling factors are dependent on the gain of the amplifiers used as the directional elements.

For tuning, the varactors 1951, 1952, 1953, and 1954 are connected to the line between P1 and P2 and the line between P3 and P4. The tunable frequency range for broadband operations is one of the important decision factors for the maximum and minimum capacitance variations of tunable elements. In order to achieve wider center frequency tuning, the varactor diodes tend to be made larger. This results in the increase of the minimum capacitance of the varactor diodes 1951, 1952, 1953, and 1954. If the minimum varactor capacitance determines the maximum operating frequency, then the maximum operation frequency may become reduced if there is wider frequency tuning. Therefore, it must be recognized that there is the interaction between the degree of re-configurability of the circuit, and the minimum and maximum tunable frequency range.

The varactors 1951, 1952, 1953, and 1954 can be used during operation to compensate for unwanted RF frequency characteristic changes by process variations, as well as enabling the active directional coupler to provide targeted RF characteristics such as matching, coupling factor, isolation, and center frequency.

Various measurements were obtained using the chip shown in FIG. 19B. FIG. 20A shows a plot of measured S-parameter results for a 3-dB coupling gain. Referring to FIG. 20A, when the coupling gain is 3 dB, the bias voltages of $V_{B1}$ and $V_{B2}$ are 0.65 V and 2.02 V, respectively. The coupled port (P4) has a 3-dB gain from the through port (P2) while the through port (P2) has roughly a 1.2-dB insertion loss from the input port (P1) at 6.7 GHz. The measured S11 graph demonstrates the return losses for the input port are better than 19 dB from 4 GHz to 10 GHz. In addition, the measured S31 graph indicates −15.5 dB at 6.7 GHz.

FIG. 20B shows a plot of directivity for a 3-dB coupling gain. Directivity indicates how well the directional coupler isolates opposite-traveling signals. The directivity is obtained by taking the magnitude of S41 (Coupled)/S31 (Isolation). The result shows that the active directional coupler has directivity of roughly 17.5 dB at 6.7 GHz. If an operational frequency range is defined by 10-dB directivity, it can be inferred that this coupler works from 5.5 GHz to 7.8 GHz, and the bandwidth is 2.3 GHz.

Figure 21A:
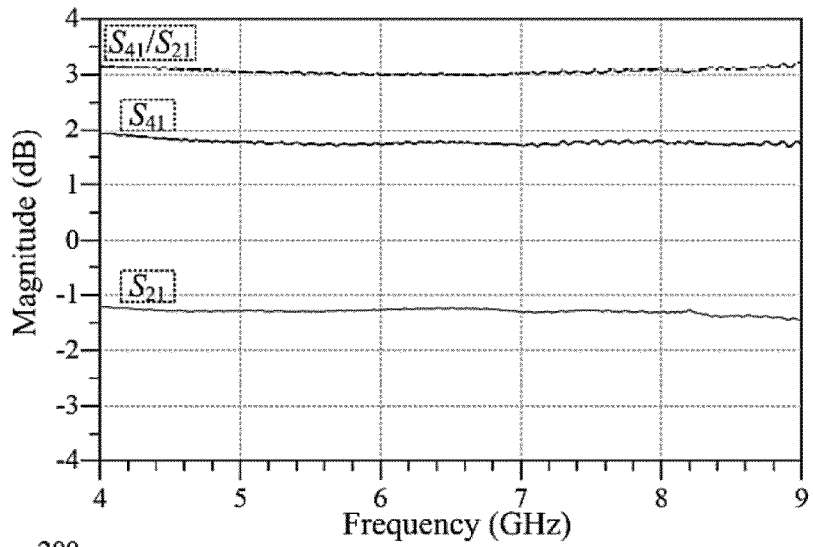
FIGS. 21A and 21B show measured magnitude (FIG. 21A) and phase (FIG. 21B) plots of S-parameters for S41 (Coupled) and S21 (Through) for a 3-dB coupling gain using the chip shown in FIG. 19B.
Figure 21B:
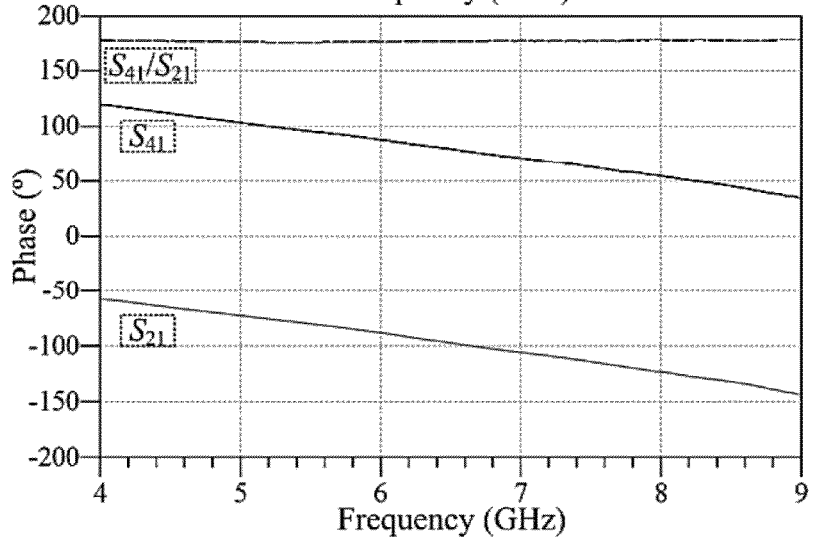

FIGS. 21A and 21B show the magnitude (FIG. 21A) and phase (FIG. 21B) plots for the coupled (S41) and through port (S21). An amplitude balance is the power difference between two output ports. Because of the characteristics of the subject directional coupler, the amplitude balance can be derived in this directional coupler for 3 dB±0.5 dB. As shown in FIG. 21B, the phase plot shows 180° difference between the coupled and through port at 5.5 GHz. The phase difference varies from 175° at 4 GHz to 185° at 7.8 GHz. A phase balance is the differential phase shift between two output ports, and it can be inferred as 180°±5°.

Figure 22A:
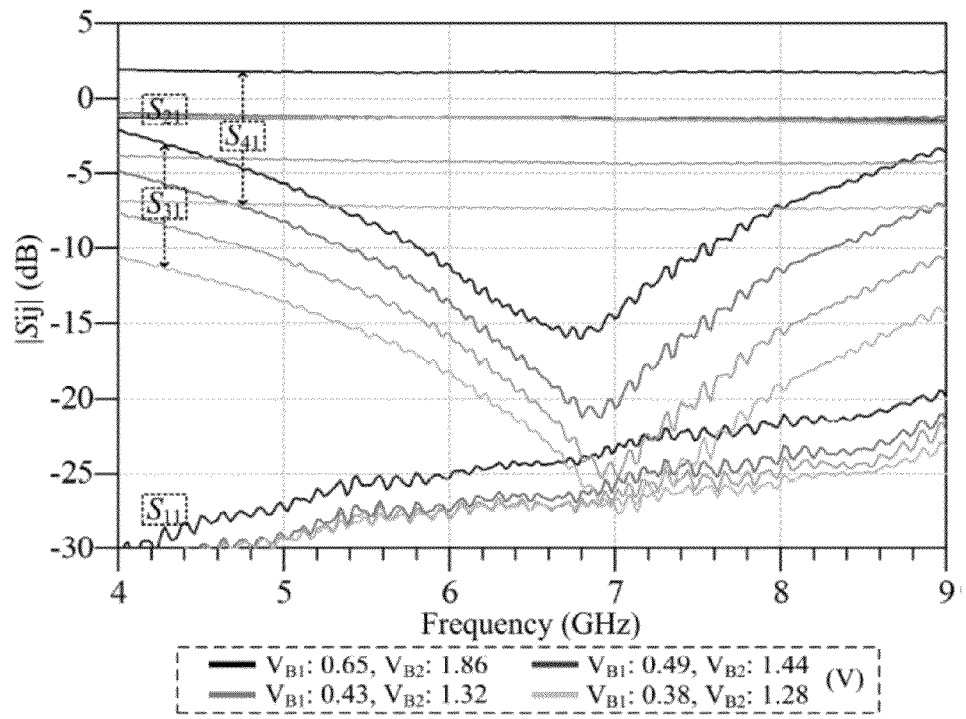
FIGS. 22A-22C show measurements of S-parameters under various conditions for the chip shown in FIG. 19B.

The tuned coupling gains can be obtained by setting different sets of bias voltages. FIG. 22A shows measured S-parameters in selected bias conditions when the coupling gains are 3 dB, 0 dB, −3 dB, and −6 dB at 6.7 GHz. The sets of voltages $V_{B1}$ and $V_{B2}$ are $V_{B1}$: 0.65 V, $V_{B2}$: 1.86 V; $V_{B1}$: 0.49 V, $V_{B2}$: 1.44 V; $V_{B1}$: 0.43 V, $V_{B2}$: 1.32 V; and $V_{B1}$: 0.38 V, $V_{B2}$: 1.28 V, which are also shown in the legend of FIG. 22A. The lines are drawn in black for 3 dB, and the colors of the lines changed gradually to light gray colors for 0 dB, −3 dB, and −6 dB.

Referring to FIG. 22A, when the coupling gain is 0 dB, the S21 and S41 graphs overlap each other. This is when the active coupler works in a similar fashion to an active hybrid coupler. Likewise, when the coupling gains are −3 dB or −6 dB, the active directional coupler works similar to a traditional 3-dB coupler or 6-dB coupler. The varactor control voltages for each coupling gain were controlled to match voltages at each relevant port. It is observed that coupling gains, center frequencies and return losses have an effect on each other at some levels as the bias conditions are changed. For example, the center frequency gets shifted higher as the coupling gain gets lower. The center frequencies for 3-dB, 0-dB, −3-dB, and −6-dB coupling gains are 6.7 GHz, 6.9 GHz, 7.0, and 7.1 GHz, respectively, and, in this case, the tuning frequency range is inferred as 0.4 GHz.

Figure 22B:
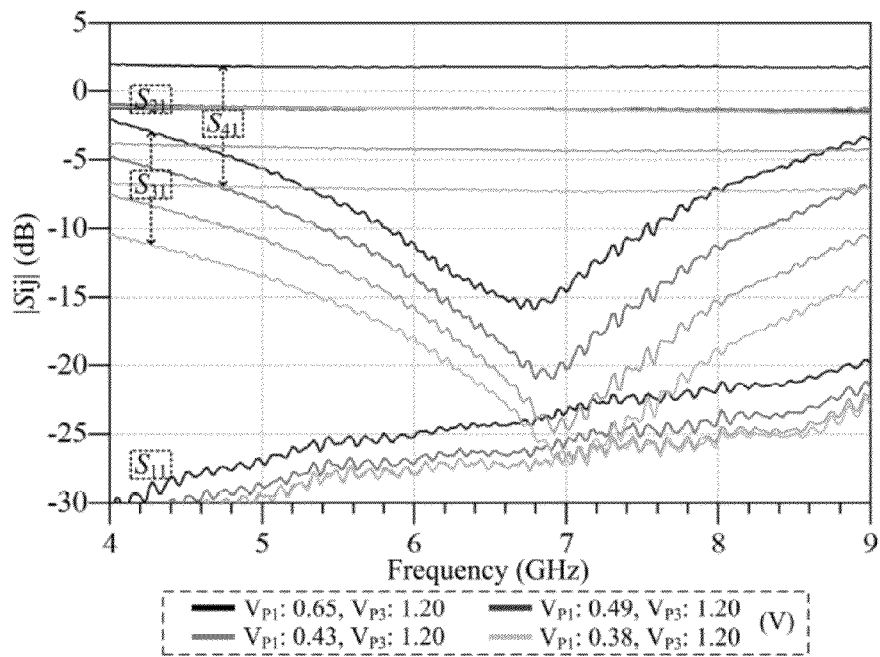

As discussed above, the bias voltages can be applied directly through input and output ports. FIG. 22B shows measured S-parameters in selected bias conditions when the coupling gains are 3 dB, 0 dB, −3 dB, and −6 dB at 6.7 GHz. for when VP1 is applied through P1 and VP3 is applied through P3. Comparing FIGS. 22A and 22B, the results from FIG. 22B agree well with the results from FIG. 22A. This indicates that transistor biasing directly through ports works similar to transistor biasing through on-chip bias inductors. It can be inferred that both bias strategies are valid and their results agrees well each other. Therefore, users can choose either of the bias techniques, and they can expect to see the similar results and operations.

Figure 22C:
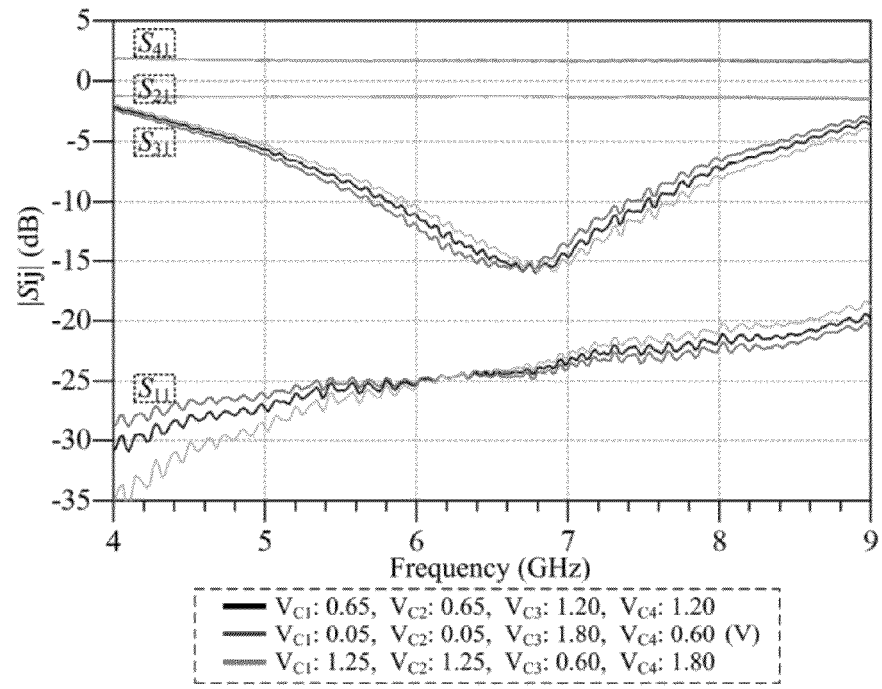

FIG. 22C shows measurements when the control voltages of the varactors 1951, 1952, 1953, and 1954 are actively changed and the transistor biasing is set for a 3-dB coupling gain. The three selected states for the varactor voltage levels $V_{C1}, V_{C2}, V_{C3},$ and $V_{C4}$ are shown in the legend of FIG. 22C. In particular, a first state involves $V_{C1}$: 0.65 V, $V_{C2}$: 0.65 V, $V_{C3}$: 1.20 V, and $V_{C4}$: 1.20 V; a second state involves $V_{C1}$: 0.05 V, $V_{C2}$: 0.05 V, $V_{C3}$: 1.80 V, and $V_{C4}$: 0.60 V; and a third state involves $V_{C1}$: 1.25 V, $V_{C2}$: 1.25 V, $V_{C3}$: 0.60 V, and $V_{C4}$: 1.80 V. As shown by the graphs in FIG. 22C, by tuning the varactor voltage levels, center frequencies of the directivity and matching impedances are tuned and the 3-dB coupling gain is well established. Based on 10-dB directivity, it can be inferred that the operational frequency is from 5.4 GHz to 7.7 GHz, and the center frequency is 6.6 GHz for the second case, also, for third case, it is from 5.6 GHz to 7.9 GHz, and its center frequency is 6.8 GHz. Therefore, the frequency tuning range for a 3-dB coupling gain is 0.2 GHz from 6.6 GHz to 6.8.

Figure 23:
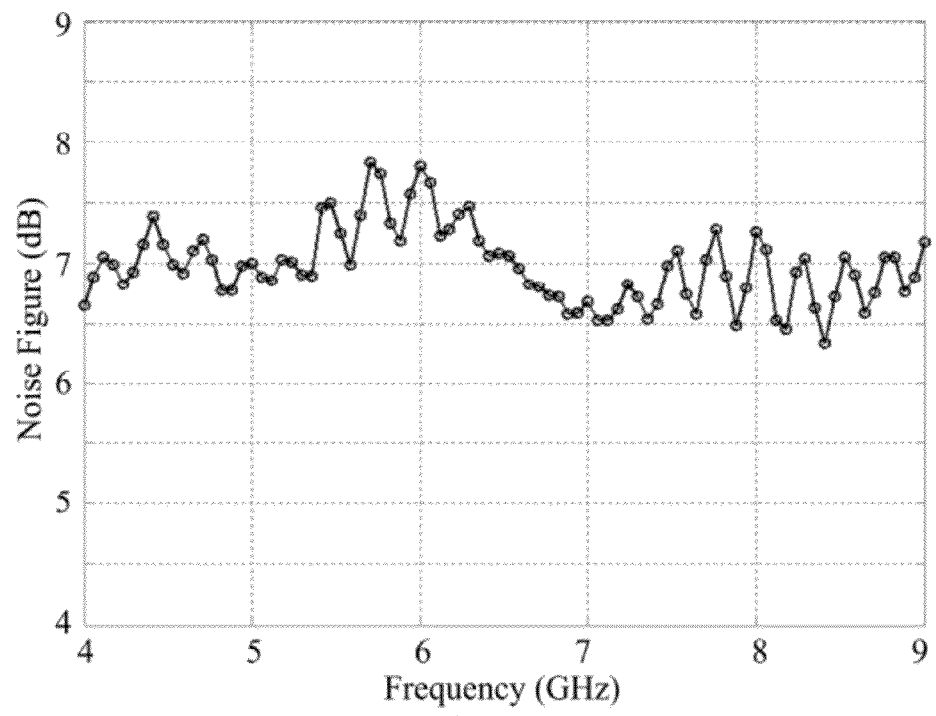
FIG. 23 shows a measured noise figure for a 3-dB coupling gain.

Because the active directional coupler works as a radio frequency amplifier from an input to a coupled port, the noise figure can be measured as a radio frequency amplifier using a spectrum analyzer and noise source from 4 GHz to 9 GHz for a 3-dB coupling gain. This is a 2-port measurement from the input (P1) to coupled port (P4), therefore, the through (P2) and isolation (P3) ports were terminated using external 50-Ω terminations at the connectors of each RF probes applied to (P2) and (P3). The spectrum analyzer was calibrated using a through pattern of an impedance standard substrate (ISS) before taking the measurements reflected in the plot of FIG. 23. As indicated by FIG. 23, the noise figure is below 8 dB from 4 GHz to 9 GHz.

Figure 24:
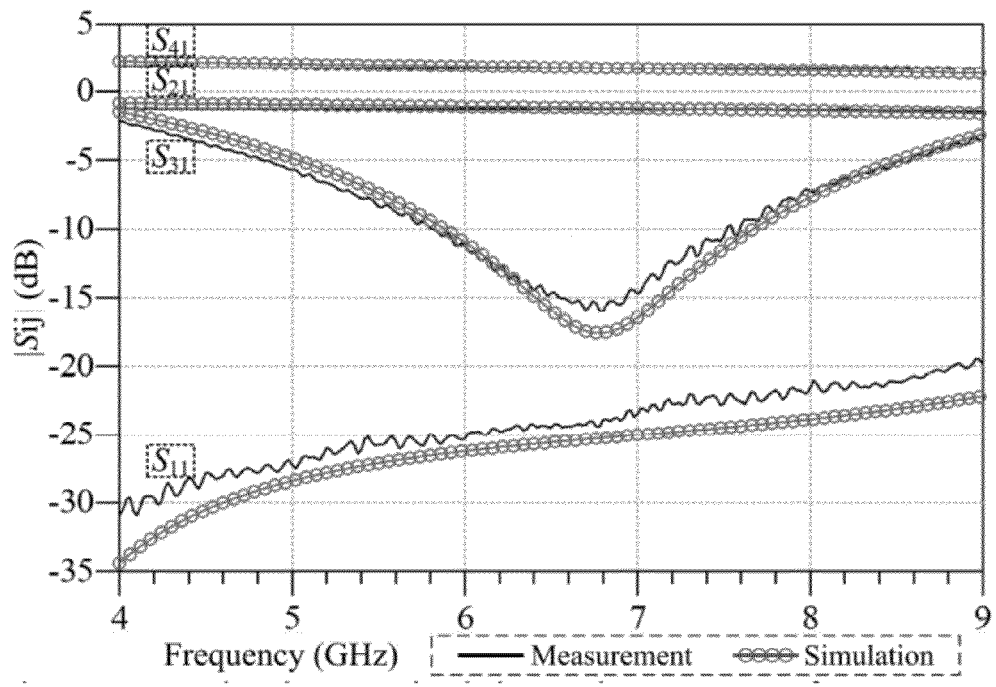
FIG. 24 shows a comparison between simulations and measurements from 4 GHz to 9 GHz for a 3-dB coupling gain.

The comparison between the measurements and a simulation (using the schematic shown in FIG. 19A) is shown in FIG. 24. The simulation was performed including equivalent circuit models for parasitic elements. The figure demonstrates comparison results of measurement and simulation. The measurement and simulation show good agreement. The S11 and S31 in simulation show a slightly better return loss and cancelation than in measurement. Overall, the agreement between the simulation and measurements appear to result from good active and passive RF models, and interconnect models including the equivalent circuit models for parasitic elements.

Figure 25:
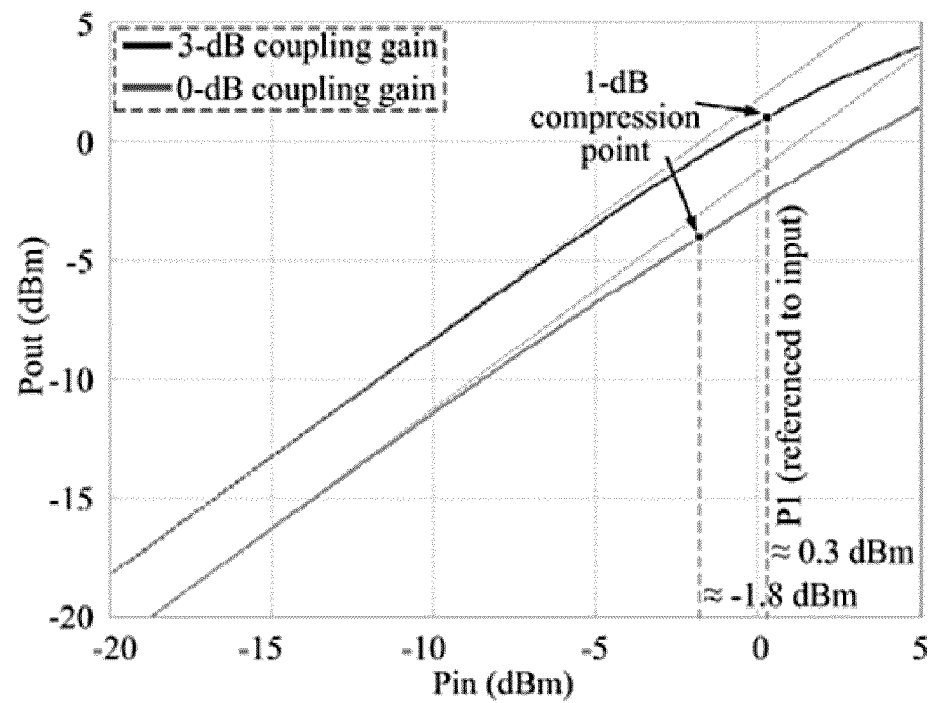
FIG. 25 shows 1 dB compression point measurements for 3-dB coupling gain and 0-dB gain coupling gain cases at 6.7 GHz using the chip of FIG. 19B.

The power measurements for the prototype tunable active directional coupler are obtained at the coupled port (P4). FIG. 25 shows the power measurements (IP-1-dB) taken using a vector network analyzer (VNA). The power measurements were carried out as 4-port measurements and source and receiver calibrations were performed at a constant level of power from 4 GHz to 9 GHz for each of 4 ports. The S41 for a 3-dB coupling gain and the S41 for a 0-dB coupling gain were measured and converted to the graphs of FIG. 25 having input power as the X-axis and output power as the Y-axis. As shown in FIG. 25, the measured IP-1-dB at 6.7 GHz is 0.3 dBm for a 3-dB coupling gain and −1.8 dBm for a 0-dB coupling gain.

The analog supply voltage is 1.2 V when it is applied directly through P3. The analog supply voltages through the multi-layer on-chip inductor for 3-dB, 0-dB, −3-dB, and −6-dB coupling gains are 1.86 V, 1.44 V, 1.32 V, and 1.28 V. The measured power consumptions are 22 mW, 6 mW, 3 mW, and 1 mW, respectively.

As illustrated by the measurements, the prototype shows 6.6~6.8-GHz high center frequencies; large 2.3-GHz-10-dB directivity bandwidth; 0.2-GHz tuning frequency range; 3~6-dB coupling gains; >20-dB return loss; <1.2-dB insertion loss; low 1.2-V bias voltage; 1~28-mW low power dissipation; 0.12-mm² small size; and high 0.3-dBm IP-1-dB.

Thus, embodiments of the subject tunable active directional coupler can tune microwave matching impedances and center frequencies by applying different varactor control voltages.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. An active directional coupler, comprising:
   a first line providing a first phase change element between a first port at one end of the first line and a second port at the other end of the first line;
   a second line providing a second phase change element between a third port at one end of the second line and a fourth port at the other end of the second line;
   a first active directional element connected at a first end to the first line and at a second end to the second line between the first port and the third port;
   a second active directional element connected at a third end to the first line and at a fourth end to the second line between the second port and the fourth port; and
   at least one varactor connected at its anode to the first line to adjust phase shift of a signal passing from the first port to the second port.

2. The active directional coupler of claim 1, wherein the first active directional element and the second active directional element each comprises a non-inverting amplifier.

3. The active directional coupler of claim 1, wherein the first active directional element and the second active directional element each comprises an inverting amplifier.

4. The active directional coupler of claim 1, wherein the first active directional element is a transistor connected as a common source amplifier between the first line and the second line and the second active directional element is a transistor connected as a common source amplifier between the first line and the second line.

5. The active directional coupler of claim 4, wherein the wherein the first phase change element and the second phase change element each comprises a phase shifter.

6. The active directional coupler of claim 5, wherein the phase shifter comprises:
   a first inductor;
   a second inductor in series with the first inductor;
   a first capacitor shunt connected at first node between the second inductor and first inductor;
   a second capacitor shunt connected at a second node of the first inductor opposite the first node; and
   a third capacitor shunt connected at third node of the second inductor opposite the first node.

7. The active directional coupler of claim 6, wherein the at least one varactor comprises three varactors, a first of the three being connected at the first node, a second of the three being connected at the second node, and a third of the three being connected at the third node.

8. The active directional coupler of claim 6, further comprising a bias inductor connected at the first node for providing a gate bias of the transistor,
wherein the at least one varactor comprises two varactors, a first of the two being connected at the second node and a second of the two being connected at the third node.

9. The active directional coupler of claim 5, wherein the phase shifter comprises an inductor.

10. The active directional coupler of claim 1, wherein the first active directional element and the second active directional element each comprises an isolator or a circulator.

11. The active directional coupler of claim 1, wherein the first active directional element is a diode and the second active directional element is a diode.

12. The active directional coupler of claim 1, wherein the first phase change element and the second phase change element each comprises a transmission line.

13. The active directional coupler of claim 12, wherein the transmission line has a length of near $\lambda/4$.

14. The active directional coupler of claim 1, wherein the first phase change element and the second phase change element each comprises a delay line.

15. The active directional coupler of claim 1, wherein the first phase change element and the second phase change element each comprises a phase shifter.

16. The active directional coupler of claim 15, wherein the phase shifter comprises an inductor.

17. The active directional coupler of claim 16, wherein the phase shifter further comprises a shunt capacitor at each end of the inductor.

18. An active directional coupler, comprising:
a first line providing a first phase change element between a first port at one end of the first line and a second port at the other end of the first line;
a second line providing a second phase change element between a third port at one end of the second line and a fourth port at the other end of the second line;
a first active directional element connected at a first end to the first line and at a second end to the second line between the first port and the third port;
a second active directional element connected at a third end to the first line and at a fourth end to the second line between the second port and the fourth port; and
at least one varactor connected at its anode to the second line to adjust phase shift of a signal passing from the third port to the fourth port.

19. The active directional coupler of claim 18, wherein the first active directional element and the second active directional element each comprises an isolator or a circulator.

20. The active directional coupler of claim 18, wherein the first active directional element is a diode and the second active directional element is a diode.

21. The active directional coupler of claim 18, wherein the first phase change element and the second phase change element each comprises a transmission line.

22. The active directional coupler of claim 21, wherein the transmission line has a length of near $\lambda/4$.

23. The active directional coupler of claim 18, wherein the first phase change element and the second phase change element each comprises a delay line.

24. The active directional coupler of claim 18, wherein the first phase change element and the second phase change element each comprises a phase shifter.

25. The active directional coupler of claim 24, wherein the phase shifter comprises an inductor.

26. The active directional coupler of claim 25, wherein the phase shifter further comprises a shunt capacitor at each end of the inductor.

27. An active directional coupler, comprising:
a first line providing a first phase change element between a first port at one end of the first line and a second port at the other end of the first line;
a second line providing a second phase change element between a third port at one end of the second line and a fourth port at the other end of the second line;
a first active directional element connected at a first end to the first line and at a second end to the second line between the first port and the third port; and
a second active directional element connected at a third end to the first line and at a fourth end to the second line between the second port and the fourth port,
wherein the first phase change element and the second phase change element each comprises a low pass, bandpass, or high pass filter.

28. An active directional coupler, comprising:
a first line providing a first phase change element between a first port at one end of the first line and a second port at the other end of the first line;
a second line providing a second phase change element between a third port at one end of the second line and a fourth port at the other end of the second line;
a first active directional element connected at a first end to the first line and at a second end to the second line between the first port and the third port; and
a second active directional element connected at a third end to the first line and at a fourth end to the second line between the second port and the fourth port;
a third line providing a third phase change element between a fifth port at one end of the third line and a sixth port at the other end of the third line;
a third active directional element connected at a first end to the first line and at a second end to the third line between the first port and the fifth port; and
a fourth active directional element connected at a third end to the first line and at a fourth end to the third line between the second port and the sixth port.

29. The active directional coupler of claim 28, further comprising:
at least one varactor connected at its anode to each line.

30. The active directional coupler of claim 29, wherein the first active directional element, the second active directional element, the third active directional element, and the fourth active directional element each comprises a source follower connected transistor.

31. The active directional coupler of claim 28, wherein the first active directional element, the second active directional element, the third active directional element, and the fourth active directional element each comprises an active divider or active balun.

32. The active directional coupler of claim 28, wherein the first active directional element and the third active directional element are provided as a first differential amplifier where a first output of the first directional amplifier is connected to the third line and a second output of the first directional amplifier is connected to the second line; and
wherein the second active directional element and the fourth active directional element are provided as a second differential amplifier where a third output of the second directional amplifier is connected to the third line and a fourth output of the second directional amplifier is connected to the second line.

33. The active directional coupler of claim 28, wherein the first active directional element and the third active directional element are provided as a first active balun where a first output of the first active balun is connected to the third line and a second output of the first active balun is connected to the second line; and wherein the second active directional element and the fourth active directional element are provided as a second active balun where a third output of the second directional amplifier is connected to the third line and a fourth output of the second active balun is connected to the second line.

34. The active directional coupler of claim 33, wherein the first active balun and the second active balun each comprises a common-source/common-gate FET pair.

35. An active directional coupler, comprising:
- a first line providing a first phase change element between a first port at one end of the first line and a second port at the other end of the first line;
- a second line providing a second phase change element between a third port at one end of the second line and a fourth port at the other end of the second line;
- a third line providing a third phase change element between a fifth port at one end of the third line and a sixth port at the other end of the third line;
- a fourth line providing a fourth phase change element between a seventh port at one end of the fourth line and an eight port at the other end of the fourth line;
- a first differential amplifier, wherein a first input of the first differential amplifier is connected to the one end of the first line, a second input of the first differential amplifier is connected to the one end of the second line, a first output of the first differential amplifier is connected to the one end of the fourth line, and a second output of the first differential amplifier is connected to the one end of the third line; and
- a second differential amplifier, wherein a third input of the second differential amplifier is connected to the other end of the first line, a fourth input of the second differential amplifier is connected to the other end of the second line, a third output of the second differential amplifier is connected to the other end of the fourth line, and a fourth output of the second differential amplifier is connected to the other end of the third line.

36. The active directional coupler of claim 35, further comprising:
at least one varactor connected at its anode to each line.

* * * * *

UNITED STATES PATENT AND TRADEMARK OFFICE
CERTIFICATE OF CORRECTION

| | | |
|---|---|---|
| PATENT NO. | : 8,704,575 B2 | Page 1 of 1 |
| APPLICATION NO. | : 13/526031 | |
| DATED | : April 22, 2014 | |
| INVENTOR(S) | : Byul Hur and William Richard Eisenstadt | |

It is certified that error appears in the above-identified patent and that said Letters Patent is hereby corrected as shown below:

In the Specification

Column 7,
Line 37, "programs choose" should read --programs to choose--.
Line 42, "tuning FIG. 3A" should read --tuning. Figure 3A--.

Column 9,
Line 7, "gmB" should read --$gm_B$--.

Column 11,
Line 9, "$(M_{BD1-1}/M_{BD1-2} \cdot M_{BD2-1}/M_{BD2-2})$" should read --$(M_{BD1-1}/M_{BD1-2}, M_{BD2-1}/M_{BD2-2})$--.

Column 13,
Line 28, "can be used other" should read --can be used in other--.

In the Claims

Column 16,
Lines 52-53, Claim 5, "wherein the wherein the" should read --wherein the--.

Signed and Sealed this
Eleventh Day of November, 2014

Michelle K. Lee
*Deputy Director of the United States Patent and Trademark Office*